(12) United States Patent
Yamakami et al.

(10) Patent No.: US 7,567,087 B2
(45) Date of Patent: Jul. 28, 2009

(54) EVALUATION BOARD AND CABLE ASSEMBLY EVALUATION METHOD

(75) Inventors: Tohru Yamakami, Shinagawa (JP); Takahiro Kondou, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 458 days.

(21) Appl. No.: 11/204,092

(22) Filed: Aug. 16, 2005

(65) Prior Publication Data

US 2006/0166525 A1     Jul. 27, 2006

(30) Foreign Application Priority Data

Jan. 25, 2005 (JP) .............................. 2005-017212
Mar. 30, 2005 (JP) .............................. 2005-099879

(51) Int. Cl.
*G01R 31/02* (2006.01)
(52) U.S. Cl. ................. 324/539; 333/17.3; 333/20; 333/28 R; 439/620.1
(58) Field of Classification Search ............... 324/539
See application file for complete search history.

(56) References Cited

U.S. PATENT DOCUMENTS

| 5,766,027 | A | * | 6/1998 | Fogg | ................. 439/76.1 |
|---|---|---|---|---|---|
| 6,617,939 | B1 | * | 9/2003 | Vermeersch | ............... 333/28 R |
| 7,002,428 | B2 | * | 2/2006 | McMorrow et al. | ........... 333/20 |
| 7,200,010 | B2 | * | 4/2007 | Broman et al. | ............... 361/760 |
| 2004/0127091 | A1 | * | 7/2004 | Naito et al. | ................. 439/488 |
| 2004/0232930 | A1 | * | 11/2004 | Shibuya et al. | ............... 324/754 |
| 2005/0182876 | A1 | * | 8/2005 | Kim et al. | .................... 710/100 |

FOREIGN PATENT DOCUMENTS

JP     2-284075     11/1990

OTHER PUBLICATIONS

Reyes, Steve, "De-embedding Using a Vector Network Analyzer Including Calibration and Measurement Techniques", Microwave Journal, Technical Feature, Mar. 2005.*
Reyes, Steve, "De-embedding Using a Vector Network Analyzer Including Calibration and Measurement Techniques", Microwave Journal, Technical Feature, Mar. 2005 (furnished in a previous office action).*

* cited by examiner

*Primary Examiner*—Timothy J Dole
*Assistant Examiner*—Benjamin M Baldridge
(74) *Attorney, Agent, or Firm*—Staas & Halsey LLP

(57) ABSTRACT

An evaluation board having an interconnection line pattern formed thereon is disclosed. The interconnection line pattern has a first end to be connected to a cable assembly and a second end to be connected to a measurement device measuring the transmission characteristic of the cable assembly. The evaluation board includes an equalizer circuit equalizing the transmission characteristic of the cable assembly.

11 Claims, 25 Drawing Sheets

EVALUATION BOARD AND CABLE ASSEMBLY EVALUATION METHOD

BACKGROUND OF THE INVENTION

1. Field of the Invention

The present invention relates generally to evaluation boards and cable assembly evaluation methods, and more particularly to an evaluation board for evaluating an equalizer circuit to be mounted in a cable assembly and a cable assembly evaluation method using an evaluation board.

2. Description of the Related Art

In a cable assembly provided with a connector for high-speed transmission, the transmission characteristics of the cable assembly change depending on the length of a cable and the diameter of a signal line passing through the cable. In general, an equalizer circuit is mounted in the cable assembly in order to obtain good transmission characteristics.

Conventionally, in order to evaluate an equalizer circuit to be mounted in the cable assembly, multiple cable assemblies having respective equalizer circuits different in element constants from one another are prepared, and their transmission characteristics are measured. In order to facilitate the connection between a measurement device and the cable assemblies, the measurement device and the cable assemblies are connected through an evaluation board provided with a socket connector corresponding to the plug connectors of the cable assemblies and with SMA socket connectors for connection to the SMA plug connectors of measurement cables extending from the measurement device.

Conventionally, a test circuit switching method using a circuit that connects an internal circuit to and disconnects it from test terminals, the circuit being provided near an interface circuit with transmission channels, is proposed (Japanese Laid-Open Patent Application No. 2-284075).

However, in the case of evaluating equalizer circuits using the conventional evaluation board, it is necessary to prepare multiple cable assemblies having respective equalizer circuits different in element constants from one another, thus resulting in poor efficiency. Further, in the case of changing the constants, it is necessary to disassemble the plug connectors and change elements, which is not easily performable.

For the above-described reasons, equalizer circuits are not evaluated with efficiency.

Further, it is impossible to evaluate equalizer circuits with accuracy only with simulations because errors occur at the time of actual mounting.

SUMMARY OF THE INVENTION

Accordingly, it is a general object of the present invention to provide an evaluation board and a cable assembly evaluation method in which the above-described disadvantages are eliminated.

A more specific object of the present invention is to provide an evaluation board and a cable assembly evaluation method that make it possible to evaluate a cable assembly with ease and accuracy.

The above objects of the present invention are achieved by an evaluation board having an interconnection line pattern formed thereon, the interconnection line pattern having a first end to be connected to a cable assembly and a second end to be connected to a measurement device measuring a transmission characteristic of the cable assembly, the evaluation board including an equalizer circuit equalizing the transmission characteristic of the cable assembly.

According to the above-described invention, it is possible to evaluate an equalizer circuit to be mounted in a cable assembly using the cable assembly without the equalizer circuit. Accordingly, it is possible to evaluate the equalizer circuit with efficiency.

The above objects of the present invention are also achieved by an evaluation board having a first interconnection line pattern formed thereon, the first interconnection line pattern having a first end to be connected to a cable assembly and a second end to be connected to a measurement device measuring a transmission characteristic of the cable assembly, the evaluation board including a second interconnection line pattern equal to the first interconnection line pattern, wherein the first and second interconnection line patterns are formed on first and second opposite surfaces, respectively, of the evaluation board.

According to the above-described invention, it is possible to measure the transmission characteristics of an evaluation board itself by measuring the transmission characteristics of an interconnection line pattern formed on the other side of the evaluation board. The transmission characteristics of the cable assembly can be measured with accuracy by eliminating the effect of the transmission characteristics of the evaluation board from the measurement results of the transmission characteristics of the cable assembly.

The above objects of the present invention are also achieved by a board for measuring a transmission characteristic of an evaluation board having an interconnection line pattern formed thereon, the interconnection line pattern having a first end to be connected to a cable assembly and a second end to be connected to a measurement device measuring a transmission characteristic of the cable assembly, the board including first and second interconnection line patterns each substantially equal to the interconnection line pattern of the evaluation board, the first and second interconnection line patterns being formed on first and second opposite surfaces, respectively, of the board, wherein an end of the first interconnection line pattern and an end of the second interconnection line pattern are connected through a via.

According to the above-described invention, it is possible to measure the transmission characteristics of a "double-length" interconnection line pattern including first and second interconnection line patterns. This makes it possible to measure the transmission characteristics of a cable assembly even when an evaluation or connection board is connected to each end of the cable assembly.

The above objects of the present invention are also achieved by a board for measuring a transmission characteristic of an evaluation board having an interconnection line pattern formed thereon, the interconnection line pattern having a first end to be connected to a cable assembly and a second end to be connected to a measurement device measuring a transmission characteristic of the cable assembly, the board including a first pattern including a first interconnection line pattern substantially equal to the interconnection line pattern of the evaluation board; and a second pattern including a second interconnection line pattern substantially equal to the interconnection line pattern of the evaluation board, wherein the first pattern and the second pattern are formed in a same plane so that one end of the first pattern and one end of the second pattern are connected.

According to the above-described invention, it is possible to measure the transmission characteristics of an evaluation board in a state close to a state where an evaluation or connection board is connected to each end of a cable assembly. Accordingly, it is possible to evaluate the transmission characteristics of the cable assembly with accuracy.

The above objects of the present invention are also achieved by a method of evaluating a cable assembly, including the step of (a) evaluating an equalizer circuit to be mounted in the cable assembly by connecting the cable assembly without the equalizer circuit to a measurement device through an evaluation board including the equalizer circuit, the measurement device measuring a transmission characteristic of the cable assembly, the equalizer circuit performing equalization.

The above objects of the present invention are also achieved by a method of evaluating a cable assembly by connecting the cable assembly to an evaluation board, including the steps of (a) measuring a transmission characteristic of the evaluation board with an interconnection line pattern for measurement substantially equal to an interconnection line pattern of the evaluation board; (b) measuring a transmission characteristic of the cable assembly by connecting the cable assembly to the evaluation board; and (c) evaluating the transmission characteristic of the cable assembly by eliminating an effect of the measured transmission characteristic of the evaluation board from the measured transmission characteristic of the cable assembly.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

First Embodiment

Figure 1:
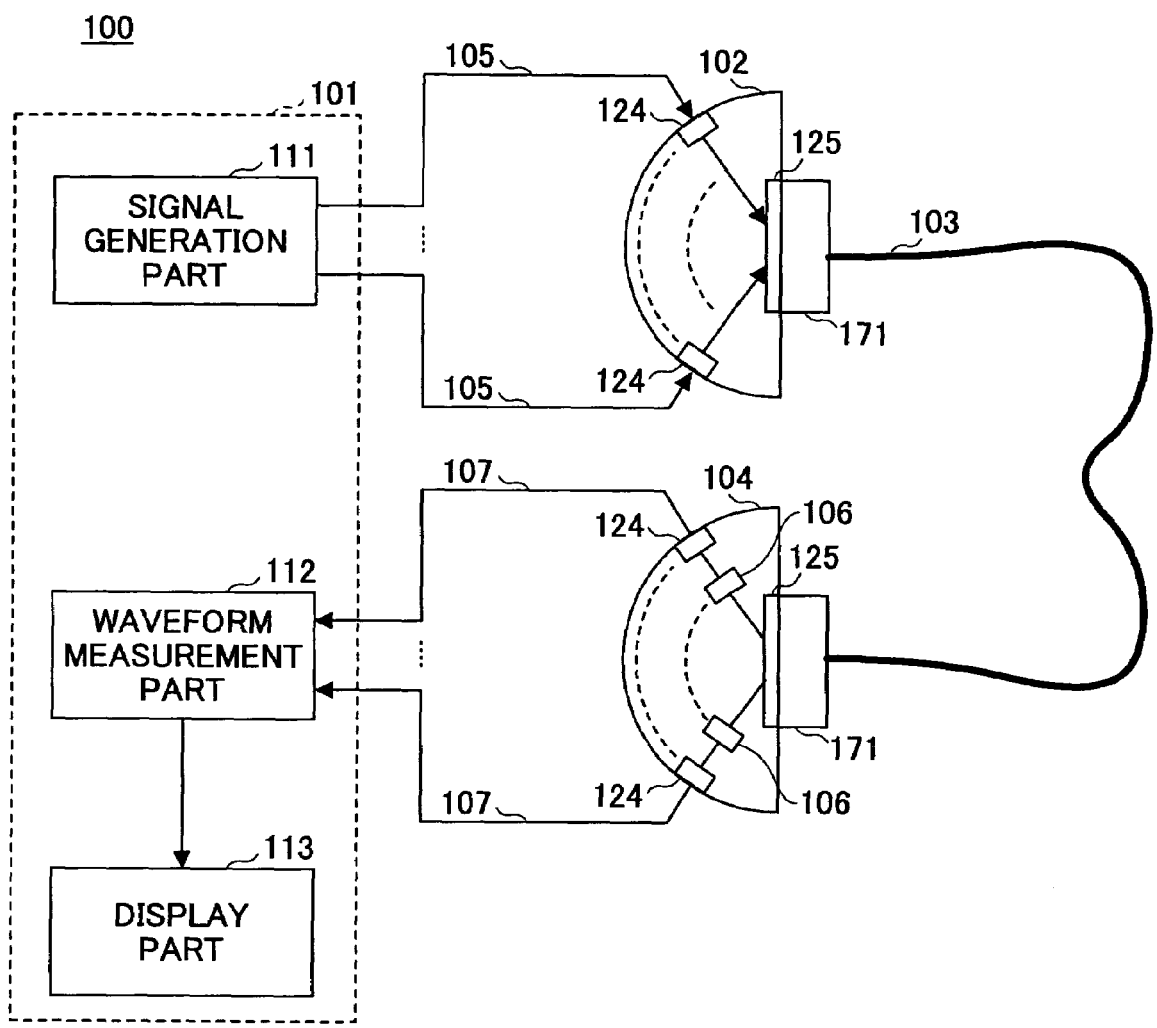
FIG. 1 is a diagram showing a system configuration according to a first embodiment of the present invention.

FIG. 1 is a diagram showing a system configuration according to a first embodiment of the present invention.

Referring to FIG. 1, an evaluation system 100 according to the first embodiment includes a measurement device 101, a connection board (a board for connection) 102, a cable assembly 103, and an evaluation board (a board for evaluation) 104.

The measurement device 101, which measures the transmission characteristics of the cable assembly 103, is formed of an oscilloscope, for instance. The measurement device 101 provides measurement signals (signals for measurement) to the cable assembly 103 through the connection board 102. The connection board 102 connects signal output cables 105 of the measurement device 101 with the cable assembly 103 through connectors. A differential transmission line pattern is formed on the connection board 102. Circuits such as an equalizer circuit are not mounted on the connection board 102. The measurement signals output from the measurement device 101 are provided to one end of the cable assembly 103 through the signal output cables 105 and the connection board 102. The cable assembly 103 is equal in configuration to those to be produced, but includes no equalizer circuit. For instance, the cable assembly 103 has the same connector configuration, cable length, and cable diameter as those to be produced.

The other end of the cable assembly 103 is connected to the evaluation board 104. The evaluation board 104 connects the cable assembly 103 and measurement cables (cables for measurement) 107 through connectors. Equalizer circuits 106 to be evaluated are mounted on the evaluation board 104. The measurement signals provided to the evaluation board 104 through the cable assembly 103 are equalized by the equalizer circuits 106 mounted on the evaluation board 104, and are provided to the measurement cables 107. The measurement signals provided to the measurement cables 107 are provided back to the measurement device 101.

The measurement device 101 measures the transmission characteristics of the cable assembly 103, such as response and loss, from the measurement signals provided from the measurement cables 107, and displays the measured transmission characteristics. The equalizer circuits 106 to be mounted in the cable assembly 103 are determined from the measurement results displayed on the measurement device 101.

(Measurement Device 101)

The measurement device 101 includes a signal generation part 111, a waveform measurement part 112, and a display part 113.

The signal generation part 111, which is connected to the connection board 102 through the signal output cables 105, generates measurement signals of pulse waveform, etc., and provides the generated measurement signals to the connection board 102. The waveform measurement part 112 is connected to the evaluation board 104 through the measurement cables 107. The waveform measurement part 112 receives the measurement signals provided through the measurement cables 107, and displays the transmission characteristics of the cable assembly 103, such as response and loss, on the display part 113.

(Evaluation Board 104)

Figure 2:
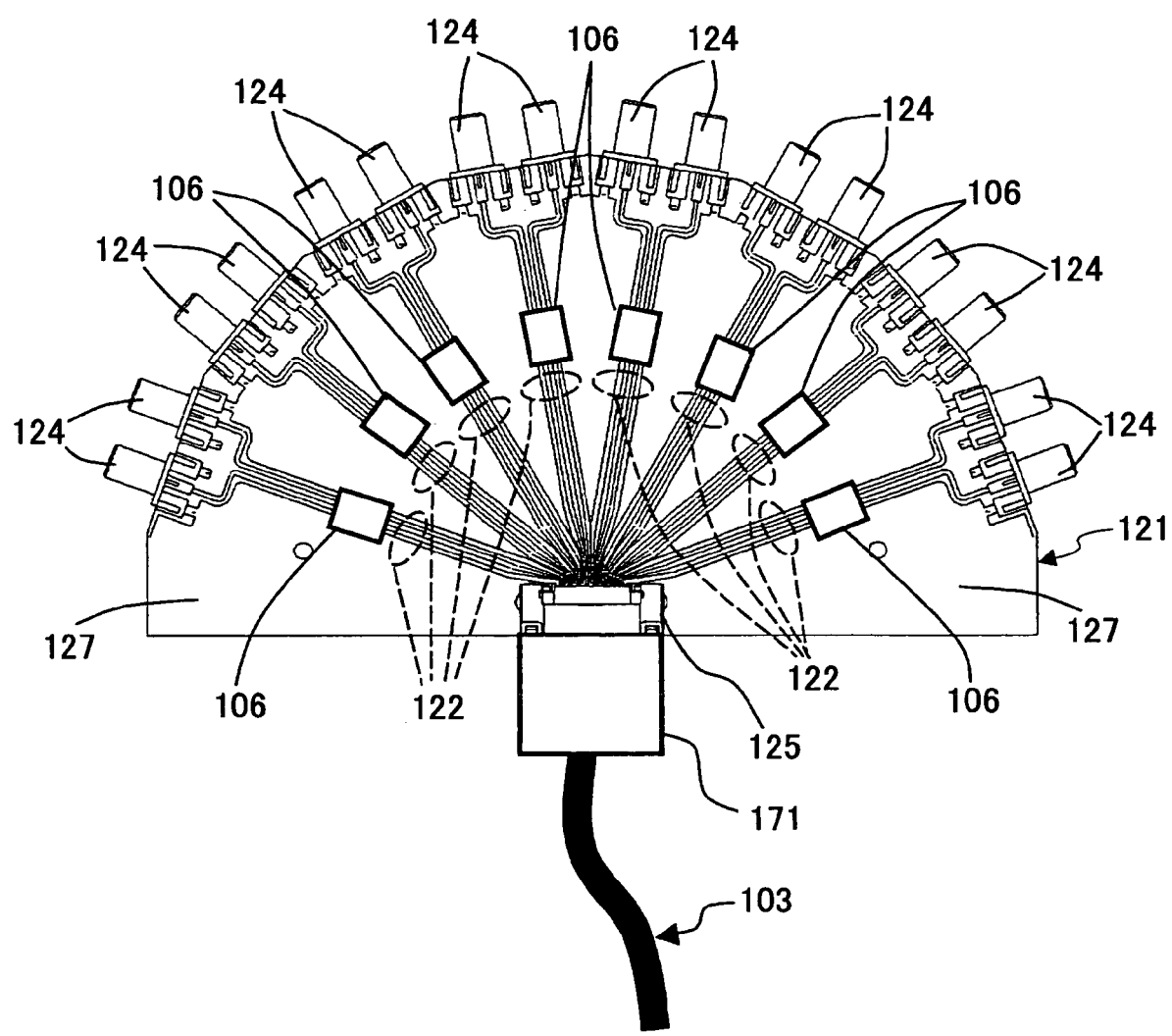
FIG. 2 is a plan view of an evaluation board according to the first embodiment of the present invention.
Figure 3:
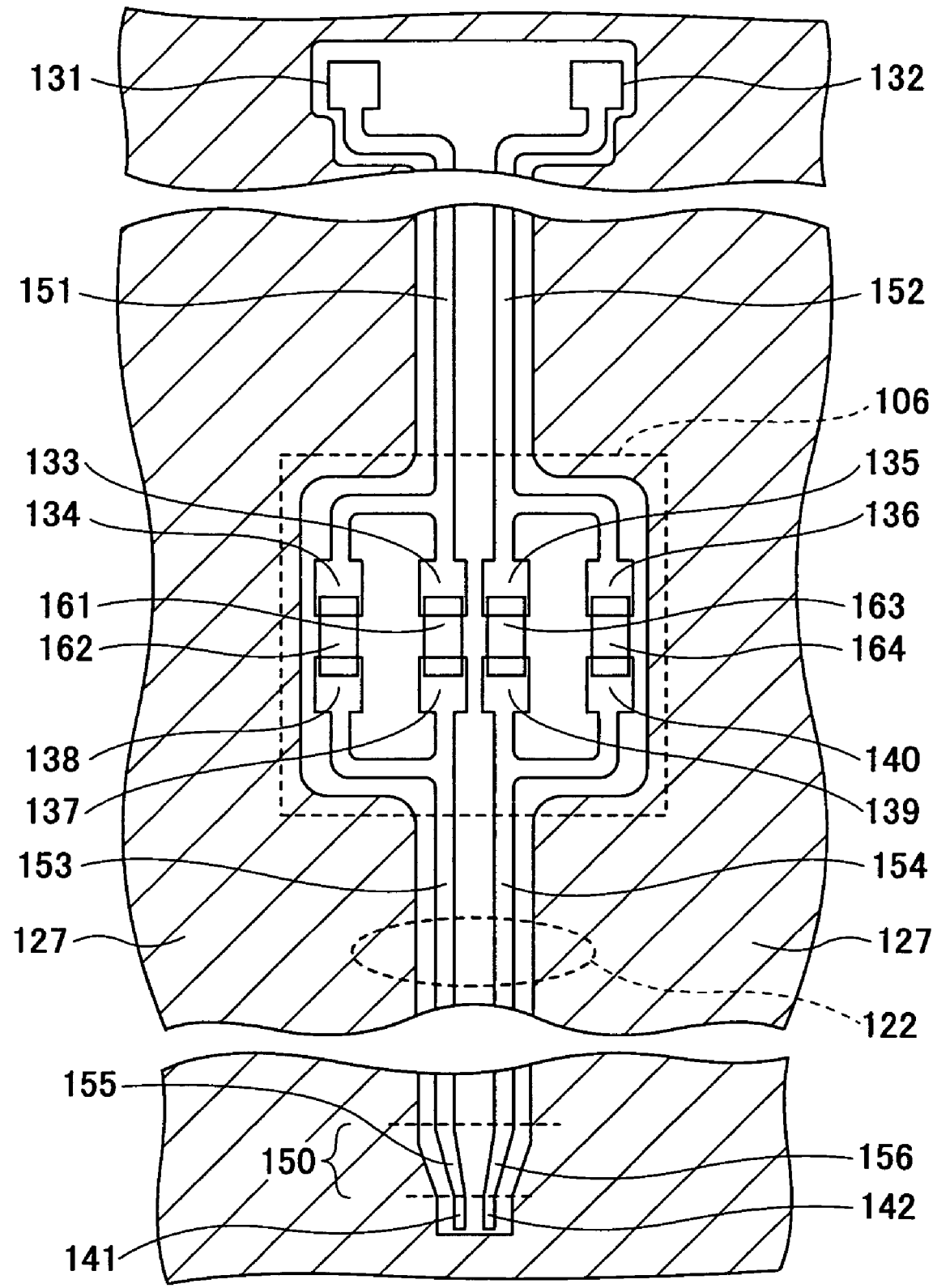
FIG. 3 is a plan view of part of the evaluation board according to the first embodiment of the present invention.

FIG. 2 is a plan view of the evaluation board 104. FIG. 3 is a plan view of part of the evaluation board 104.

The evaluation board 104 includes a semicircular epoxy-resin substrate 121, differential transmission line patterns 122, multiple SMA (Sub Miniature Type A) connectors 124, a socket connector 125, and the equalizer circuits 106. The differential transmission line patterns 122, which are conductive patterns of a conductive material such as copper or aluminum, are formed on the substrate 121. The SMA connectors 124, the socket connector 125, and the electronic components of the equalizer circuits 106 are mounted on the substrate 121.

Each differential transmission line pattern 122 includes connection pads 131 through 142, differential transmission lines 151 through 154, and a narrow line part 150 including narrow line portions 155 and 156. Each of the connection pads 131 and 132, which is formed in the mounting part of the corresponding SMA socket connector 124, has the signal input part of the corresponding SMA socket connector 124 soldered thereto. The connection pad 131 is connected to one end of the differential transmission line 151. The connection pad 132 is connected to one end of the differential transmission line 152.

The other end of the differential transmission line 151 branches off to be connected to the connection pads 133 and 134. The other end of the differential transmission line 152 branches off to be connected to the connection pads 135 and 136.

The connection pad 137 is provided opposite the connection pad 133. The connection pad 138 is provided opposite the connection pad 134. A chip resistor 161 is soldered between the connection pads 133 and 137. A chip capacitor 162 is soldered between the connection pads 134 and 138. The connection pad 139 is provided opposite the connection pad 135. The connection pad 140 is provided opposite the connection pad 136. A chip resistor 163 is soldered between the connection pads 135 and 139. A chip capacitor 164 is soldered between the connection pads 136 and 140.

The connection pads 137 and 138 are connected to one end of the differential transmission line 153. The other end of the differential transmission line 153 is connected to the connection pad 141 through the narrow line part 155. A corresponding signal line of the socket connector 125 is soldered to the connection pad 141.

The connection pads 139 and 140 are connected to one end of the differential transmission line 154. The other end of the differential transmission line 154 is connected to the connection pad 142 through the narrow line part 156. A corresponding signal line of the socket connector 125 is soldered to the connection pad 142. The width and the pitch of the differential transmission lines 151 through 154 are set to be greater than the width and the pitch of the connection pads 141 and 142. This makes it possible to reduce the degradation of the transmission characteristics of the differential transmission lines 151 through 154.

On the surface of the epoxy-resin substrate 121, a ground pattern 127 is formed over the substantially entire part other than the differential transmission line patterns 122, the connection pads 131, 132, 141, and 142, and their periphery. The ground pattern 127 is so formed as to avoid connection to the differential transmission line patterns 122 and the connection pads 131, 132, 141, and 142.

The SMA socket connectors 124 are soldered to the circumferential edge part of the epoxy-resin substrate 121. As many SMA socket connectors 124 as the number of signal lines of the cable assembly 103 are provided.

An SMA plug connector is provided to one end of each measurement cable 107 (shown in FIG. 1). The other end of each measurement cable 107 is connected to the waveform measurement part 112 (shown in FIG. 1) of the measurement device 101 (shown in FIG. 1). The SMA socket connectors 124 are connected to the SMA plug connectors of the corresponding measurement cables 107. A plug connector 171 of the cable assembly 103 is connected to the socket connector 125 of the evaluation board 104.

Each equalizer circuit 106 is formed by soldering chip components such as the chip resistors 161 and 163 and the chip capacitors 162 and 164 to the connection pads 133 through 140 provided in the middle part of the corresponding differential transmission line pattern 122. The chip components are equal to those (chip resistors and chip capacitors) to be mounted in the plug connector 171 of the cable assembly 103 at the time of its production. This makes it possible to evaluate the equalizer circuits 106 in a state close to that at the time of mounting.

The evaluation board 104 has a substantially semicircular shape so that all the differential transmission line patterns 122 interposed between the SMA socket connectors 124 and the socket connector 125 are substantially equal in length.

The connection board 102 (shown in FIG. 1) is equal in configuration to the evaluation board 104 without the equalizer circuits 106.

(Equalizer Circuit 106)

A description is given of the equalizer circuit 106.

Figure 4:
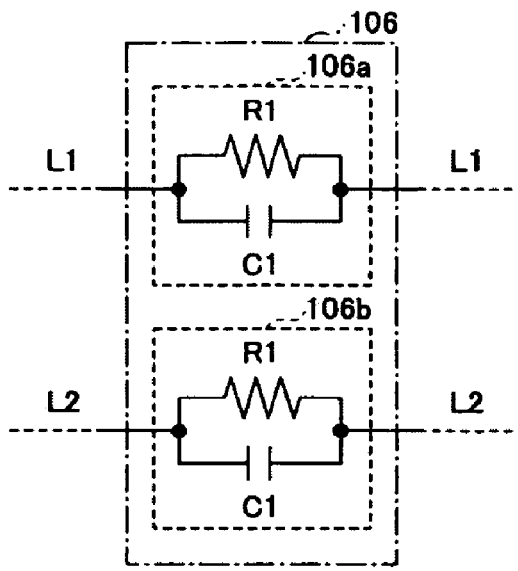
FIG. 4 is a circuit diagram showing the equivalent circuit of an equalizer circuit according to the first embodiment of the present invention.

FIG. 4 is a circuit diagram showing the equivalent circuit of the equalizer circuit 106.

The equalizer circuit 106 is configured by inserting a parallel circuit 106a of a resistor R1 and a capacitor C1 and a parallel circuit 106b of the resistor R1 and the capacitor C1 into transmission lines L1 and L2, respectively, forming differential transmission lines. The transmission characteristics of the equalizer circuit 106 to be mounted in the cable assembly 103 (shown in FIG. 1) can be evaluated by measuring the transmission characteristics while changing the resistor R1 and the capacitor C1.

(Variations of Equalizer Circuit 106)

The equalizer circuit 106 according to the present invention is not limited to the parallel circuits each of the resistor R1 and the capacitor C1.

Figure 5:
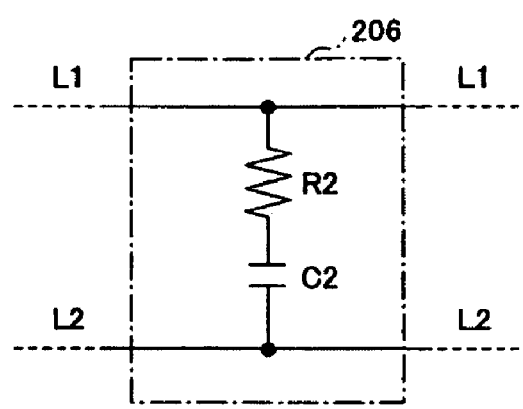
FIG. 5 is a circuit diagram showing the equivalent circuit of a variation of the equalizer circuit according to the first embodiment of the present invention.

FIG. 5 is a circuit diagram showing an equalizer circuit 206 that is the equivalent circuit of a variation of the equalizer circuit 106.

The equalizer circuit 206 is configured by connecting a series circuit of a resistor R2 and a capacitor C2 between the transmission lines L1 and L2 forming differential transmission lines. The transmission characteristics of the equalizer circuit 206 to be mounted in the cable assembly 103 can be evaluated by measuring the transmission characteristics while changing the resistor R2 and the capacitor C2.

Figure 6:
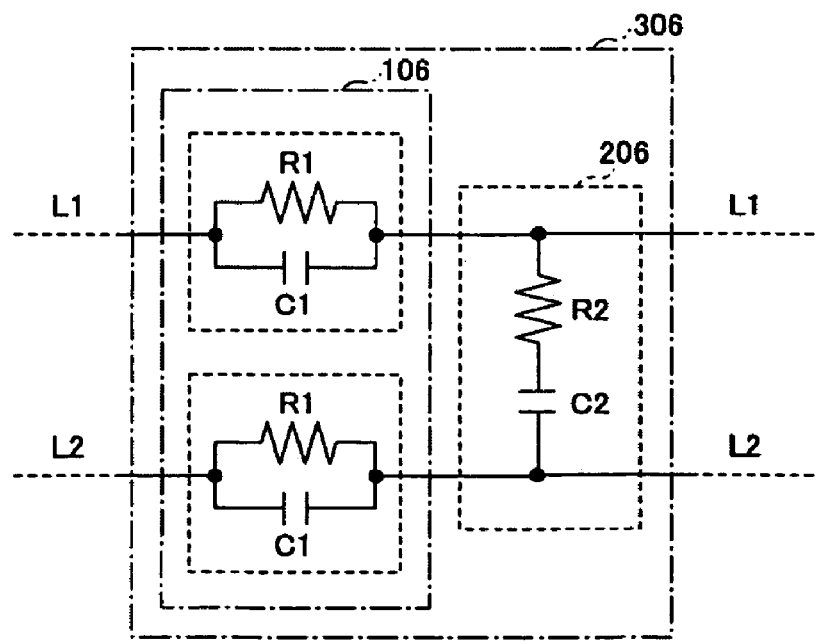
FIG. 6 is a circuit diagram showing the equivalent circuit of another variation of the equalizer circuit according to the first embodiment of the present invention.

FIG. 6 is a circuit diagram showing an equalizer circuit 306 that is the equivalent circuit of another variation of the equalizer circuit 106.

The equalizer circuit 306 is configured by combining the equalizer circuit 106 and the equalizer circuit 206. The transmission characteristics of the equalizer circuit 306 to be mounted in the cable assembly 103 (shown in FIG. 1) can be evaluated by measuring the transmission characteristics while changing the resistors R1 and R2 and the capacitors C1 and C2. Since it is possible to change four elements in total, the transmission characteristics can be set finely.

(Plug Connector 171)

Figure 7A:
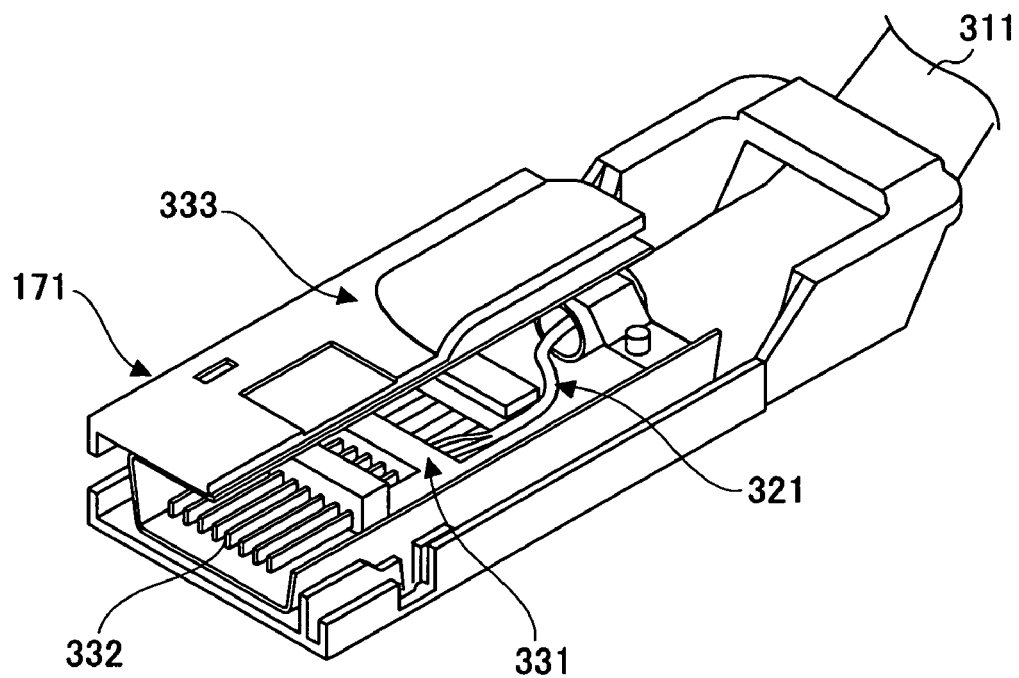
FIGS. 7A and 7B are perspective views of part of a cable assembly according to the first embodiment of the present invention.
Figure 7B:
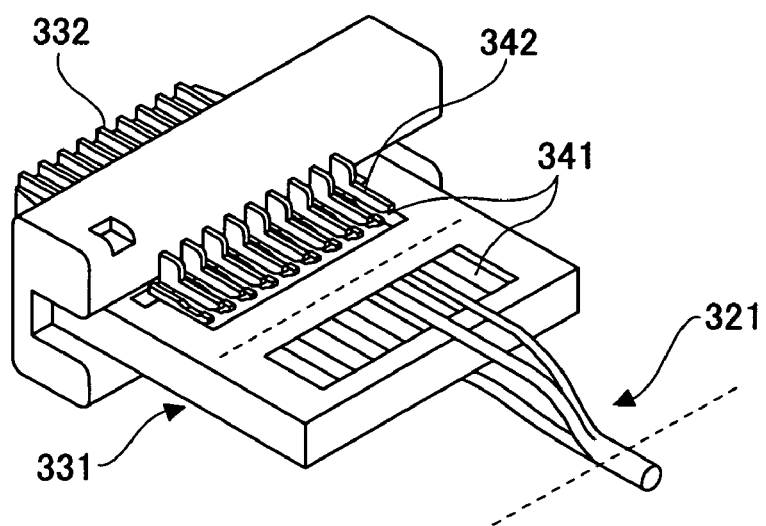

FIGS. 7A and 7B are perspective views of a connector portion and a contact portion, respectively, of the plug connector 171.

Referring to FIGS. 7A and 7B, the cable assembly 103 (shown in FIG. 1) includes a cable 311 and the plug connector 171.

Multiple signal lines 321 run through the cable 311, and the end of each signal line 321 is connected to the plug connector 171. The plug connector 171 includes a paddle card 331, a contact part 332, and a metal case 333.

Connection patterns 341 are formed on the paddle card 331. The end of the corresponding signal line 321 is soldered to one end of each connection pattern 341. A corresponding one of contacts 342 to come into contact with the socket connector 125 of the evaluation board 104 is press-fitted to the other end of each connection pattern 341.

At the time of evaluation, the paddle card 331 with no equalizer circuit 106 mounted on each connection pattern 341 is employed. At the time of production, the same equalizer circuits 106 (shown in FIG. 1) as those achieving good transmission characteristics in measurement with the measurement device 101 (shown in FIG. 1) are mounted on the paddle card 331.

(Method of Evaluating Equalizer Circuit 106)

Referring again to FIG. 1, one end of the cable assembly 103 on which no equalizer circuit is mounted is connected to the connection board 102, and the other end thereof is connected to the evaluation board 104. Next, the measurement device 101 is started so that transmission characteristics such as an eye pattern and loss are measured. At this point, measurement is performed using the equalizer circuits 106 that are different in element constants such as resistance and capacitance. The equalizer circuits 106 of element constants that have achieved the best transmission characteristics are determined as equalizer circuits to be mounted in the cable assembly 103, and are mounted on the interconnection lines of the paddle card 331 to be housed in the plug connector 171. Thereby, a cable assembly having the same transmission characteristics as the best transmission characteristics obtained with the measurement device 101 can be obtained.

According to this embodiment, the equalizer circuits 106 mounted on the evaluation board 104 have the same element constants. Accordingly, in evaluating the equalizer circuits 106, multiple evaluation boards 104 different from each other in the element constants of the equalizer circuits 106 mounted thereon are prepared, and the cable assembly 103 is connected to and disconnected from each of the evaluation boards 104. Alternatively, if the differential transmission line patterns (differential transmission line pairs) 122 have substantially the same transmission characteristics, the equalizer circuits 106 different in element constants from each other may be mounted on the same evaluation board 104, so that the equalizer circuits 106 of different element constants can be evaluated with the single evaluation board 104.

According to this embodiment, an equalizer circuit to be mounted in a cable assembly can be evaluated without preparing multiple cable assemblies having respective equalizer circuits of different characteristics.

Second Embodiment

Figure 8:
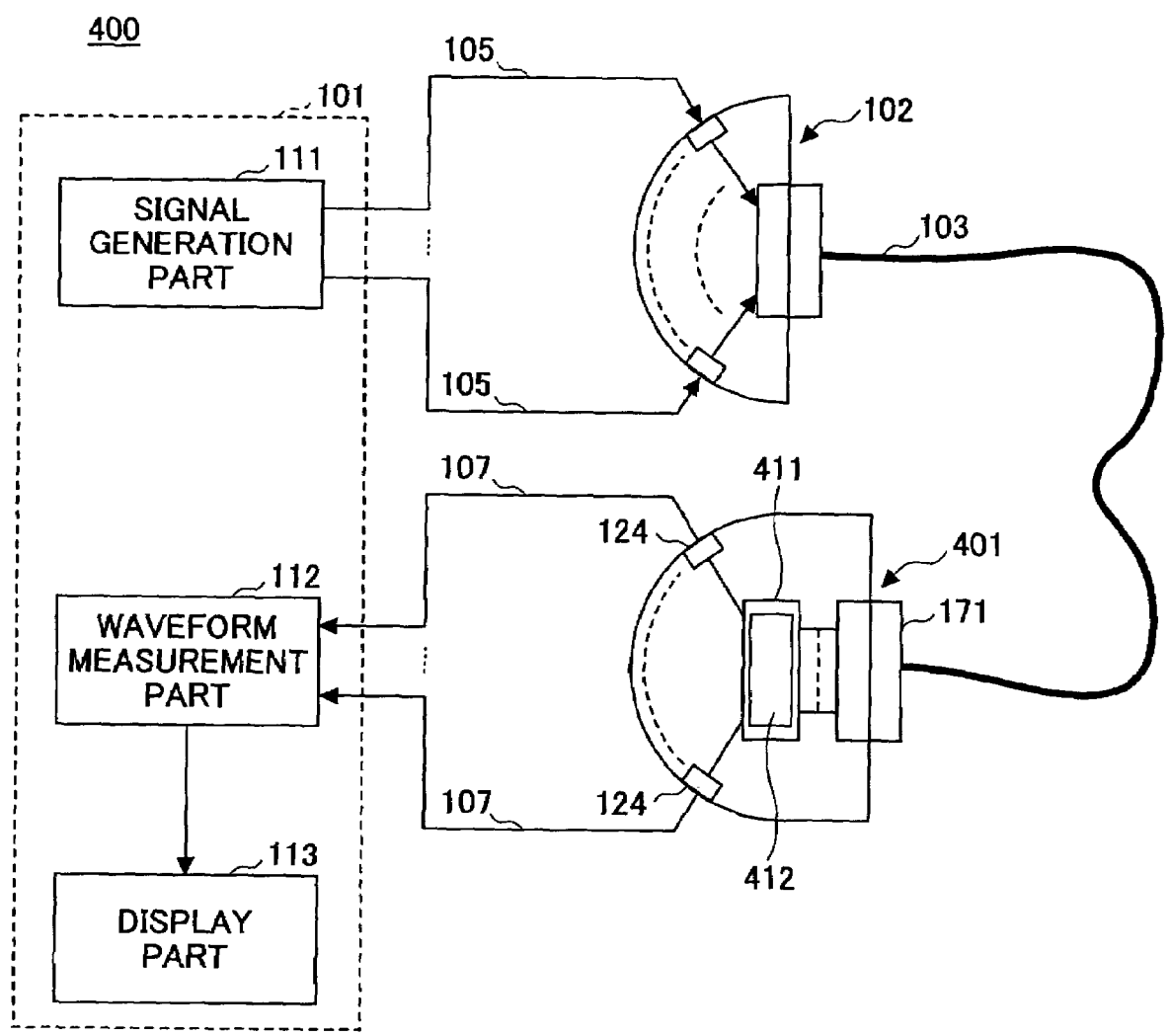
FIG. 8 is a diagram showing a system configuration according to a second embodiment of the present invention.

FIG. 8 is a diagram showing a system configuration according to a second embodiment of the present invention. In FIG. 8, the same elements as those of FIG. 1 are referred to by the same numerals, and a description thereof is omitted.

Referring to FIG. 8, an evaluation system 400 according to the second embodiment is different from the evaluation system 100 of the first embodiment in the configuration of an evaluation board.

Figure 9:
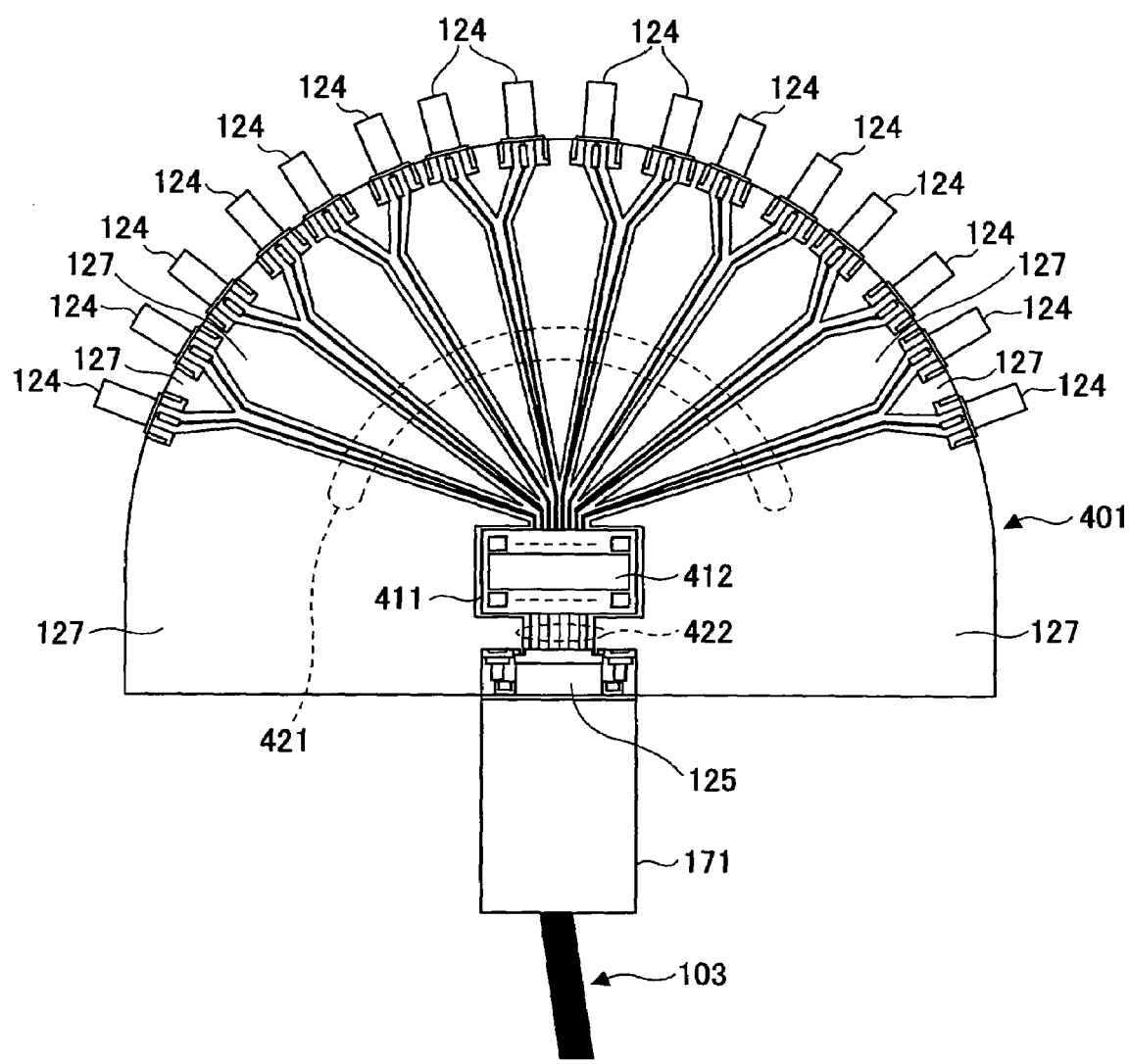
FIG. 9 is a plan view of an evaluation board according to the second embodiment of the present invention.

FIG. 9 is a plan view of an evaluation board 401 of the evaluation system 400 (shown in FIG. 8).

The evaluation board 401 includes a module socket 411 provided between the SMA socket connectors 124 and the socket connector 125. An equalizer module 412 is attached to the module socket 411. The equalizer module 412 is an electronic module integrating as many equalizer circuits 106 (shown in FIG. 1) as the number of differential transmission line pairs. The equalizer module 412 includes a printed board on which chip components are mounted, an IC chip where a resistor and a capacitor are mounted on a semiconductor substrate, and a hybrid substrate on which a chip component and an IC chip are mounted.

The SMA socket connectors 124 are connected to the module socket 411 through differential transmission lines 421. On the evaluation board 401, the SMA socket connectors 124 are disposed on an arc centered on the module socket 411 so that the differential transmission lines 421 are substantially equal in the distance between the SMA socket connector 124 and the module socket 411. Further, the module socket 411 is connected to the socket connector 125 through differential transmission lines 422. The differential transmission lines 422 are patterned substantially in parallel so as to have substantially the same distance between the module socket 411 and the socket connector 125.

According to this embodiment, it is possible to change the transmission characteristics of the equalizer circuits 106 by replacing the equalizer module 412. This eliminates the necessity of connecting the cable assembly 103 (shown in FIG. 1) to and disconnecting the cable assembly 103 from the socket connector 125, thus making it possible to perform equalizer evaluation quickly.

By mounting the equalizer module 412 directly on the paddle card 331 (FIGS. 7A and 7B) of the plug connector 171 of the cable assembly 103, the same transmission characteristics as the evaluation results can be obtained in the cable assembly 103.

Third Embodiment

Figure 10:
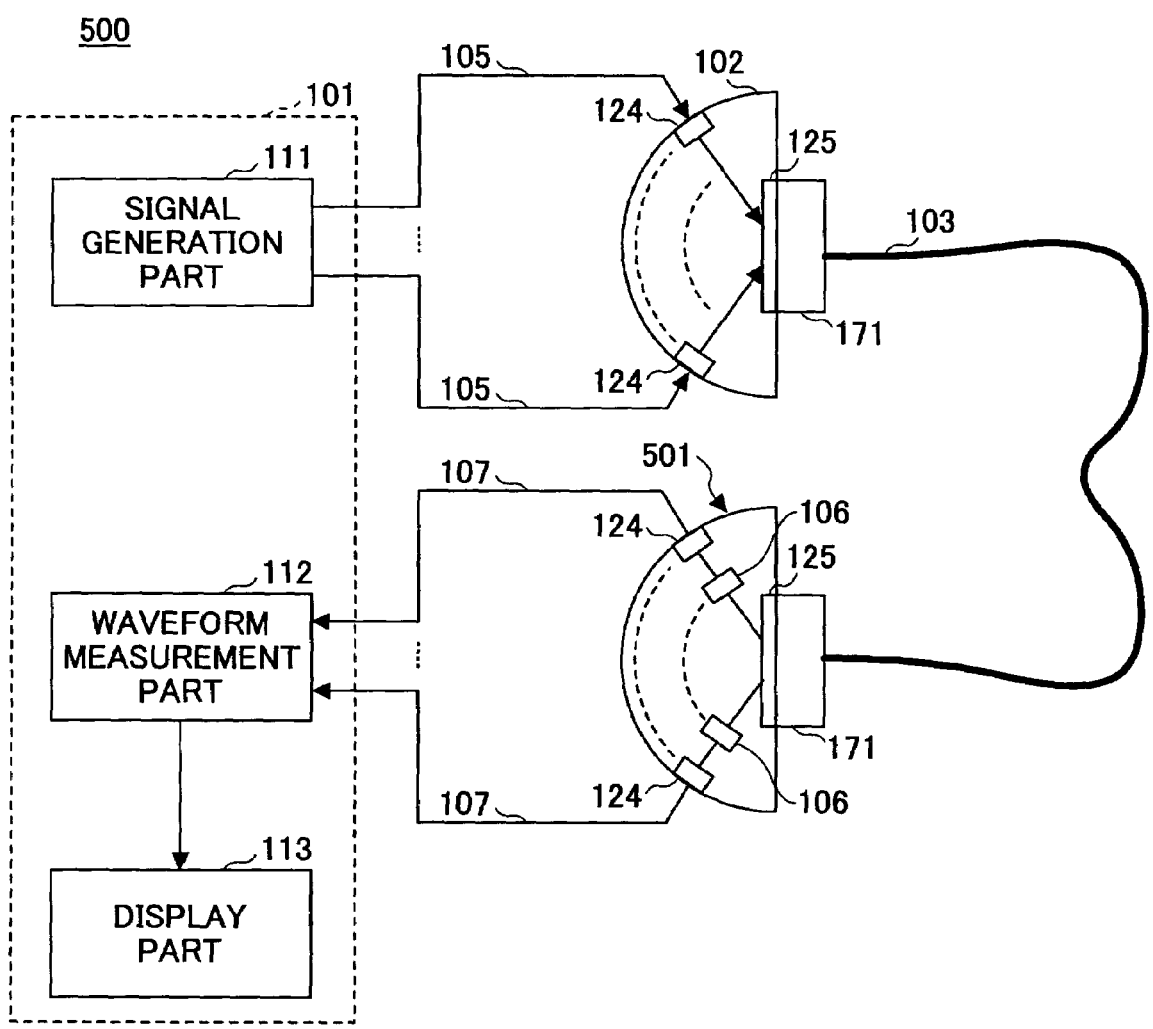
FIG. 10 is a diagram showing a system configuration according to a third embodiment of the present invention.

FIG. 10 is a diagram showing a system configuration according to a third embodiment of the present invention. In FIG. 10, the same elements as those of FIG. 1 are referred to by the same numerals, and a description thereof is omitted.

Referring to FIG. 10, an evaluation system 500 according to the third embodiment is different from the evaluation system 100 of the first embodiment in the configuration of an evaluation board and the evaluation procedure.

Figure 11:
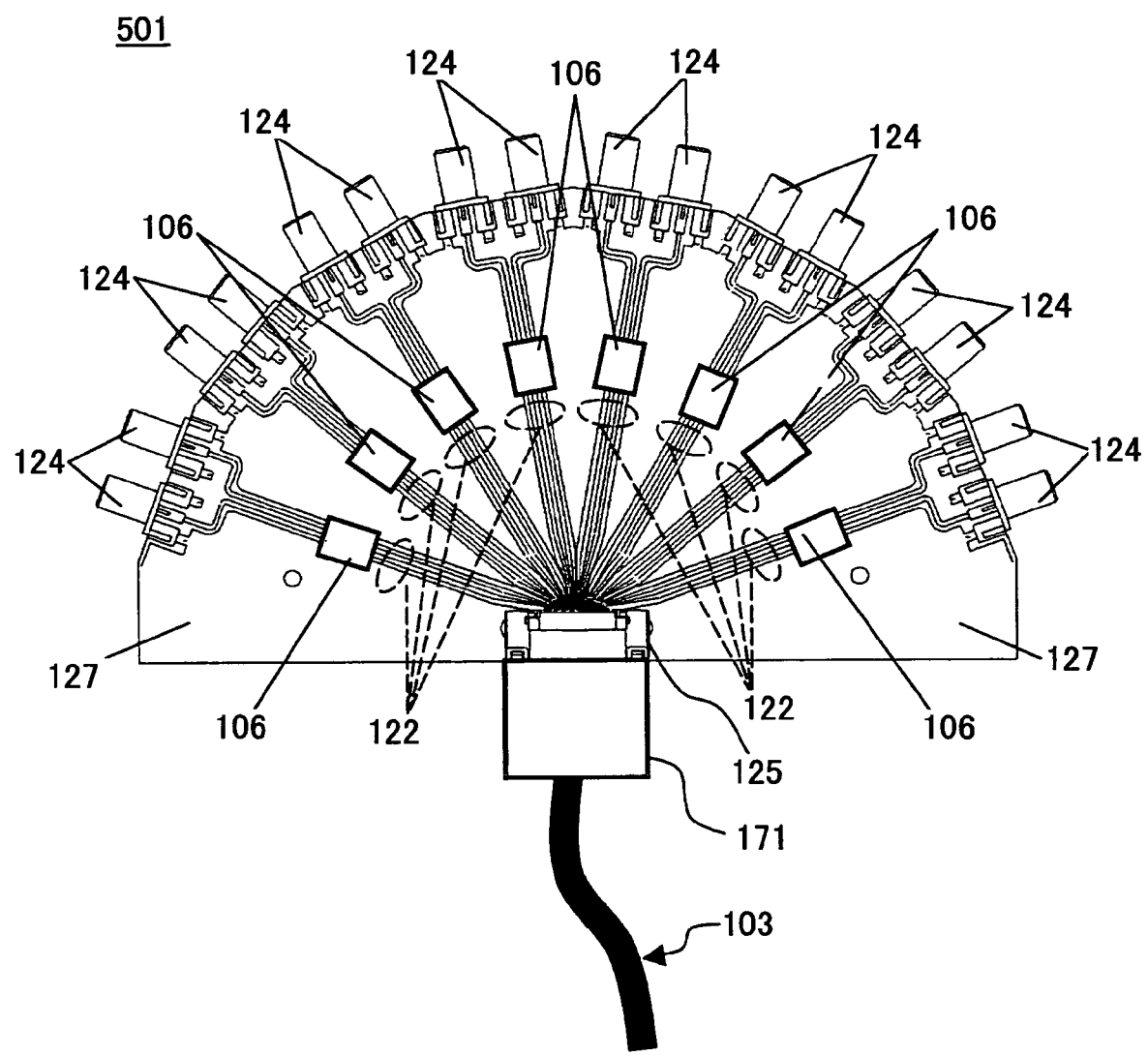
FIG. 11 is a top plan view of an evaluation board according to the third embodiment of the present invention.
Figure 12:
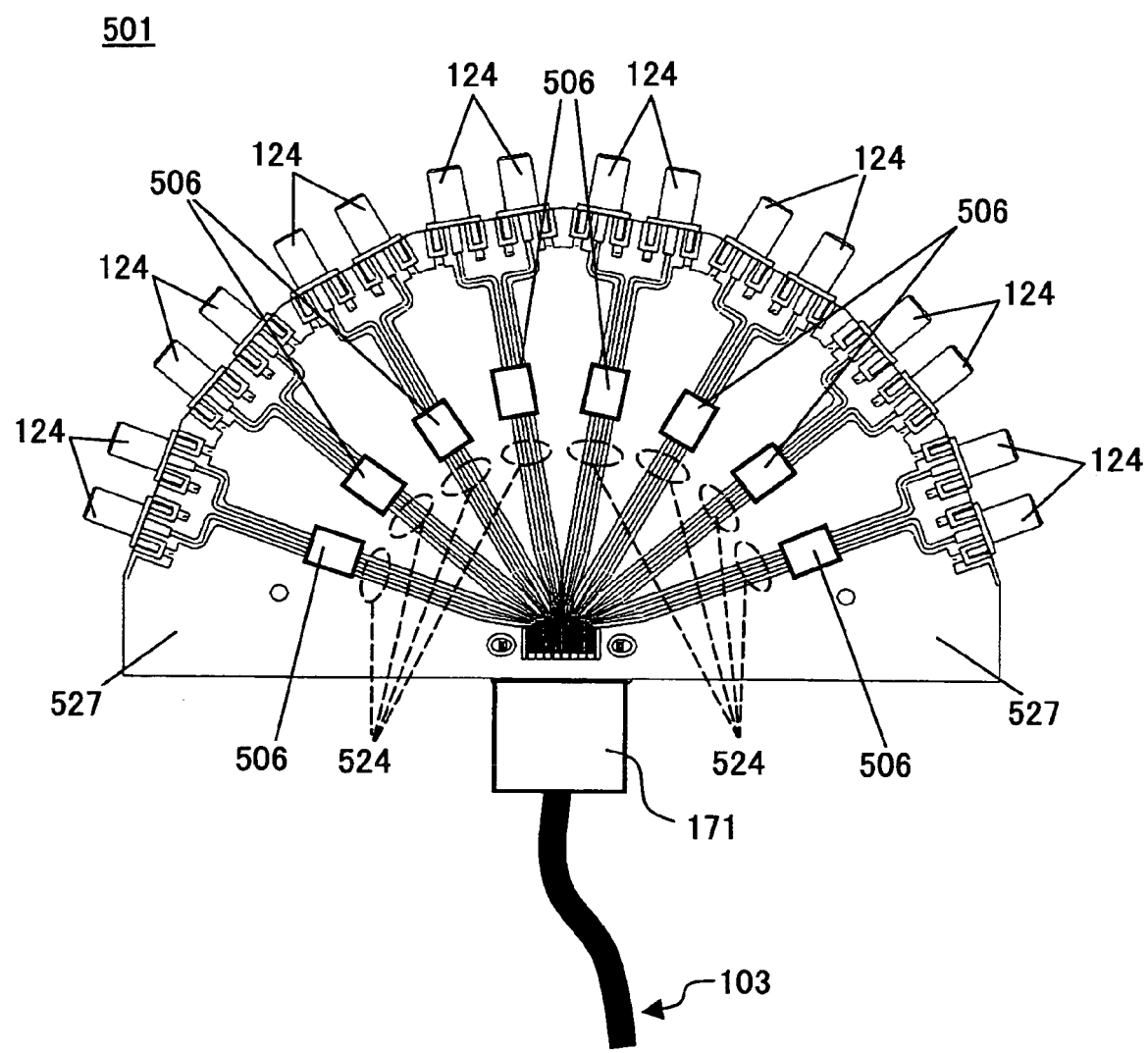
FIG. 12 is a bottom plan view of the evaluation board according to the third embodiment of the present invention.
Figure 13:
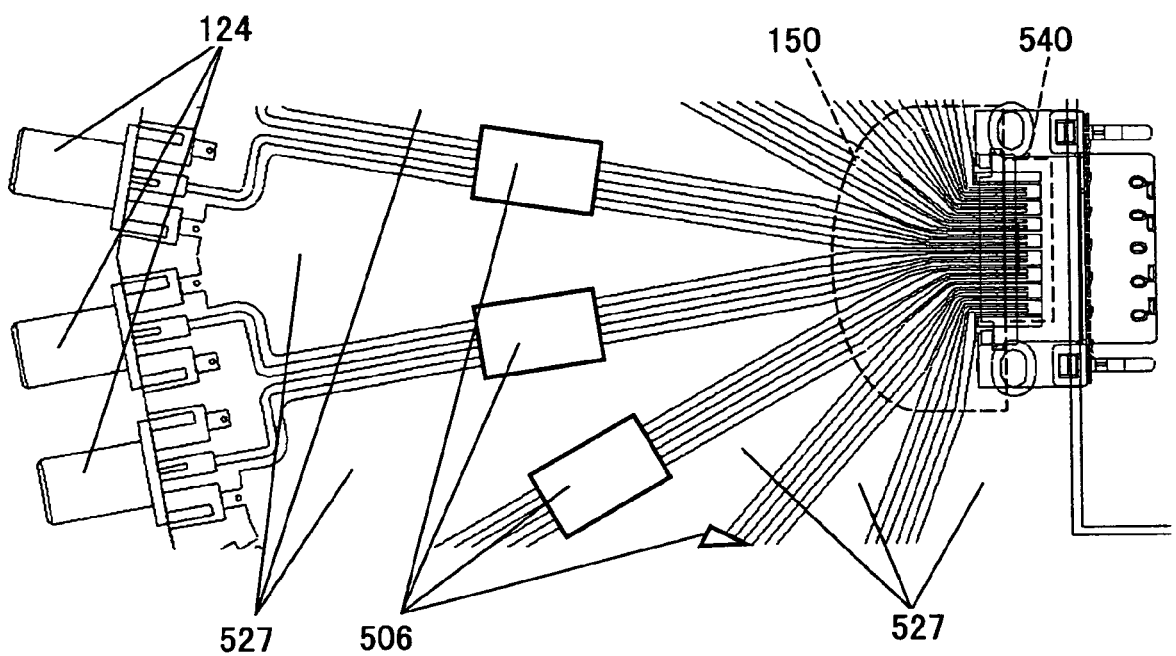
FIG. 13 is a plan view of part of the bottom surface of the evaluation board according to the third embodiment of the present invention.
Figure 14:
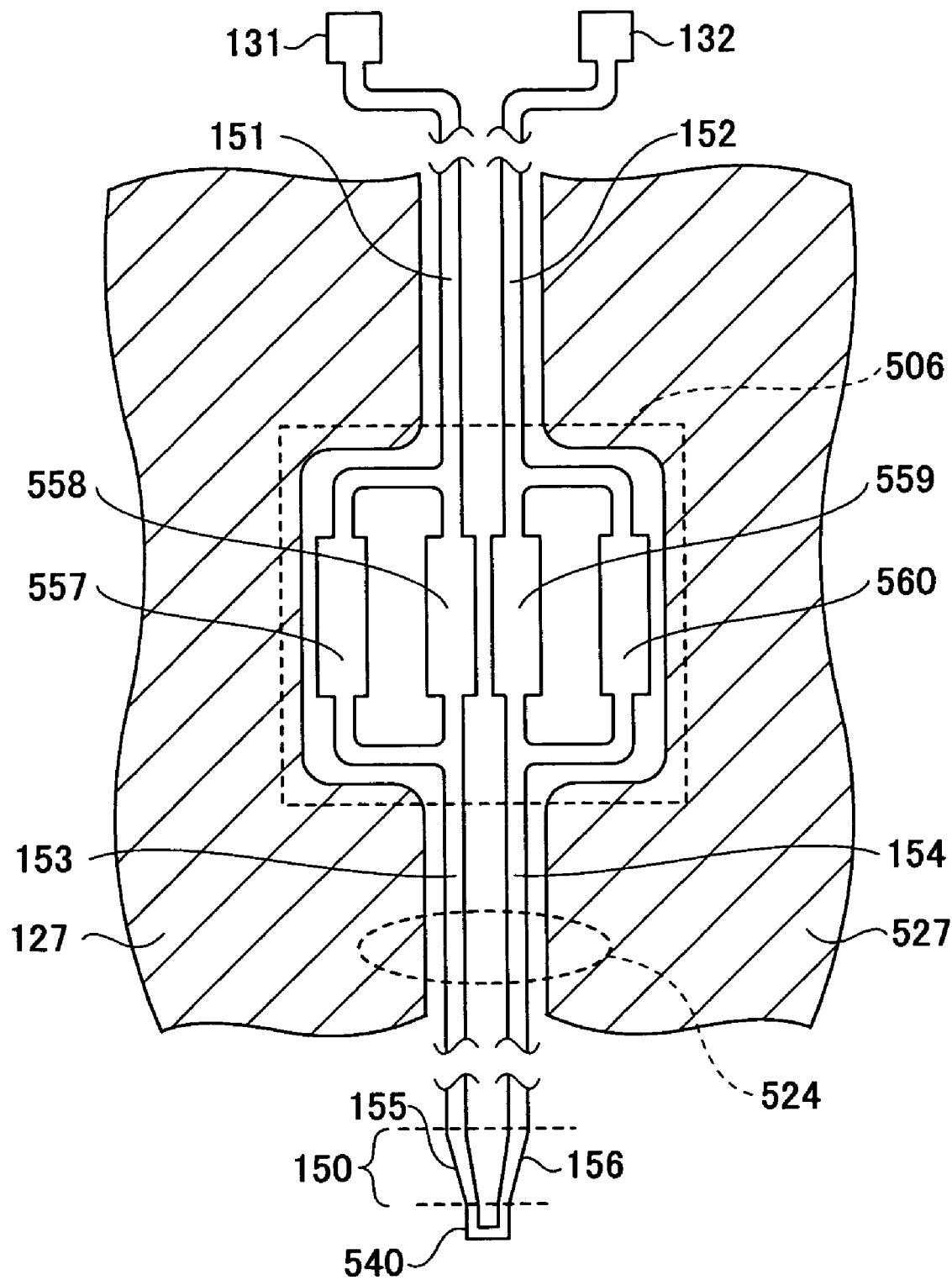
FIG. 14 is a diagram showing an interconnection line pattern on the bottom surface of the evaluation board according to the third embodiment of the present invention.

FIG. 11 is a top plan view of an evaluation board 501 of the evaluation system 500. FIG. 12 is a bottom plan view of the evaluation board 501. FIG. 13 is a plan view of part of the bottom surface of the evaluation board 501. FIG. 14 is a diagram showing an interconnection line pattern on the bottom surface of the evaluation board 501. In FIGS. 11 through 14, the same elements as those of FIGS. 2 and 3 are referred to by the same numerals, and a description thereof is omitted.

On the bottom surface of the evaluation board 501 shown in FIG. 12, differential transmission line patterns 524, which are substantially the same as the differential transmission line patterns 122 formed on the top surface of the evaluation board 501 shown in FIG. 11, are formed. Each differential transmission line pattern 524 includes the connection pads 131 and 132, a short-circuit pattern part 506, a turnback pattern part 540, the differential transmission lines 151 through 154, and the narrow line part 150. A ground pattern 527 formed on the bottom surface of the evaluation board 501 corresponds to the ground pattern 127 formed on the top surface of the evaluation board 501.

The short-circuit pattern part 506 includes short-circuit patterns 557 through 560 (shown in FIG. 14). The short-circuit pattern 557 is a pattern short-circuiting the connection pads 134 and 138 shown in FIG. 3. The short-circuit pattern 558 is a pattern short-circuiting the connection pads 133 and 137 shown in FIG. 3. The short-circuit pattern 559 is a pattern short-circuiting the connection pads 135 and 139 shown in FIG. 3. The short-circuit pattern 560 is a pattern short-circuiting the connection pads 136 and 140 shown in FIG. 3.

The turnback pattern part 540 is a pattern short-circuiting the adjacent connection pads 141 and 142 shown in FIG. 3. Provision of the turnback pattern part 540 makes it possible to measure the transmission characteristics of the patterns of the connection board 102 and the evaluation board 501 connected to corresponding ends of the cable assembly 103 by measuring transmission characteristics between the connection pads 131 and 132. In the case of measuring transmission characteristics between the connection pads 131 and 132, crosstalk cannot be measured. In the case of measuring crosstalk, a transmission characteristic (a crosstalk signal) between the connection pad 131 and the turnback pattern part 540 is measured by providing a test signal between the connection pad 132 and the turnback pattern part 540. As a result, crosstalk can be measured. In this case, crosstalk in one of the boards 102 and 501 is measured. The signal generation part 111 is connected between the connection pad 132 and the turnback pattern part 540, and the waveform measurement part 112 is connected between the connection pad 131 and the turnback pattern part 540. Thereby, a signal is provided to one transmission line, and the waveform of the other transmission line at that time is measured.

Next, a description is given of an evaluation operation according to this embodiment.

Figure 15:
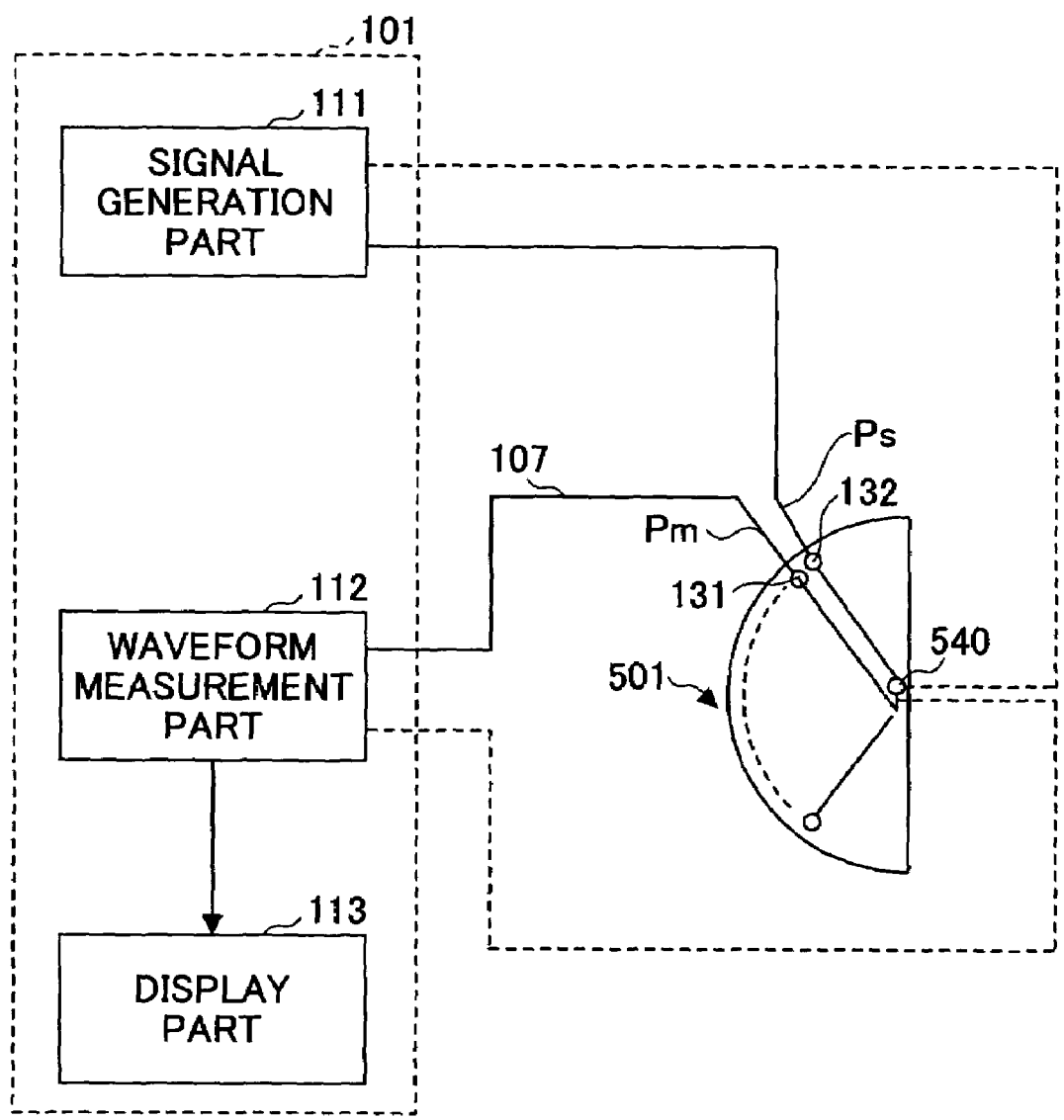
FIG. 15 is a diagram for illustrating an evaluation board evaluation operation according to the third embodiment of the present invention.

FIG. 15 is a diagram for illustrating an evaluation board evaluation operation according to the third embodiment of the present invention.

According to this embodiment, before evaluating the equalizer circuits 106, a probe Ps of the signal generation part 111 and a probe Pm of the waveform measurement part 112 are brought into contact with the corresponding connection pads 132 and 131, respectively, on the bottom surface of the evaluation board 501 as shown in FIG. 15. Thereby, the transmission characteristics of the corresponding differential transmission line pattern 524 are measured. The transmission characteristics include insertion loss, crosstalk, reflection loss, and an eye pattern.

Next, measurement at the time of evaluating the equalizer circuits is performed as described in the first embodiment, using the top surface side of the evaluation board 501. The results of measurement with the differential transmission line patterns 524 are reflected in the results of measurement in the equalizer circuits 106. Thereby, measurement results that are not affected by the differential transmission patterns 122 of the evaluation board 501 can be obtained. For instance, in the case of measuring insertion loss as a transmission characteristic, it is possible to measure only the insertion loss of the cable assembly 103 with accuracy without the insertion loss of the evaluation board 501 being reflected in the measurement results by subtracting the insertion loss of the differential transmission line patterns 524 from the insertion loss at the time of evaluation of the equalizer circuits 106.

In the case of simply measuring the transmission characteristics of the cable assembly 103, each short-circuit pattern part 506 corresponding to a part on which to mount the equalizer circuit 106 may be omitted and replaced by a pattern connecting the differential transmission lines before and after the short-circuit pattern part 506.

Fourth Embodiment

According to this embodiment, the transmission characteristics of the evaluation board 104 for measurement are measured using a first test evaluation board 601 and a second test evaluation board 602, and are reflected in measurement results using the evaluation board 104.

Figure 16:
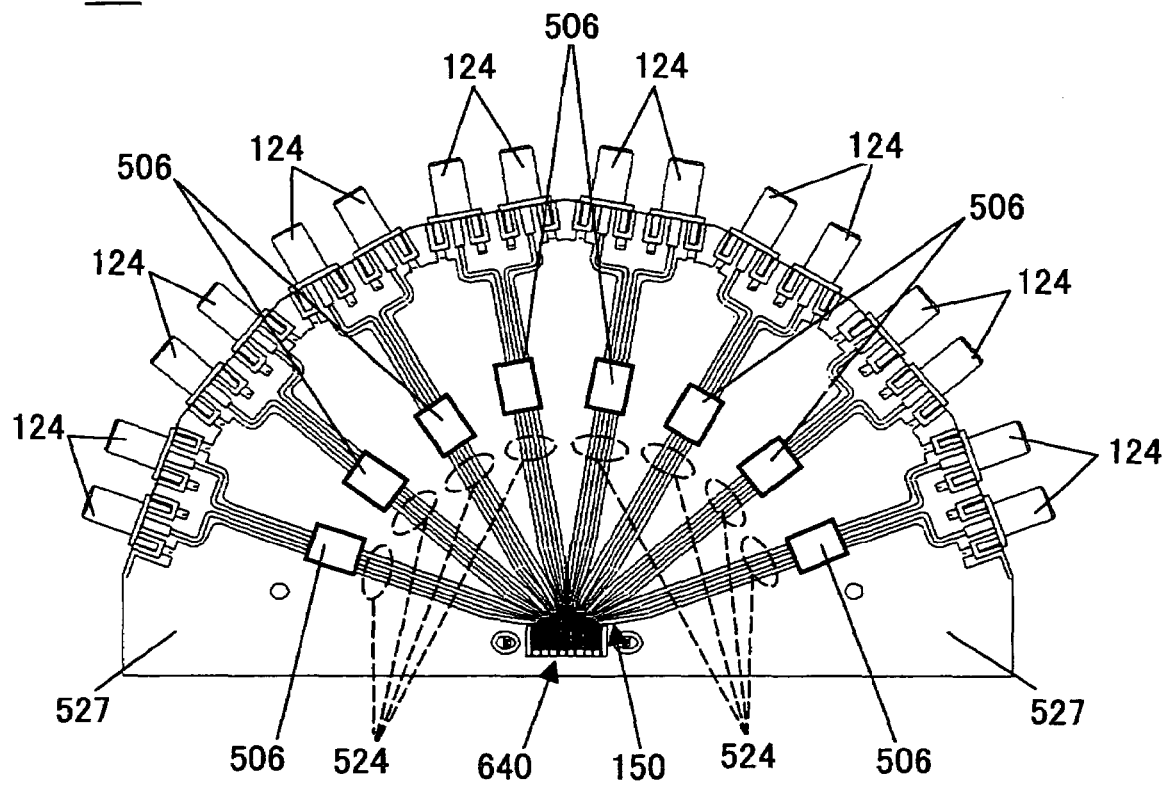
FIG. 16 is a top plan view of a first test evaluation board according to a fourth embodiment of the present invention.
Figure 17:
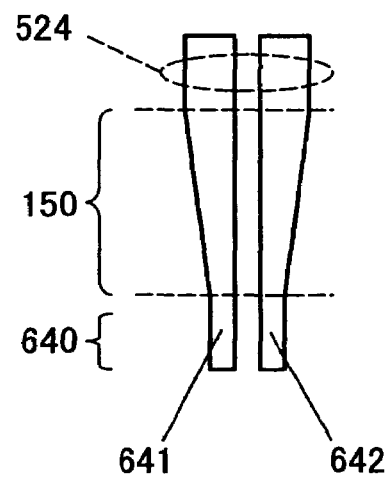
FIG. 17 is a top plan view of part of the first test evaluation board according to the fourth embodiment of the present invention.

FIG. 16 is a top plan view of the first test evaluation board 601. FIG. 17 is a top plan view of part of the first test evaluation board 601. In FIGS. 16 and 17, the same elements as those described above are referred to by the same numerals, and a description thereof is omitted.

Substantially the same patterns as the differential transmission line patterns 524 formed on the bottom surface of the evaluation board 501 of the third embodiment are formed on the first test evaluation board 601. The turnback pattern part 540 of each differential transmission line pattern 524 is replaced by a connection pattern part 640. The connection pattern part 640 separates the differential transmission line pattern 524 into a connection pattern 641 and a connection pattern 642. The ground pattern 527 is formed on the substantially entire top surface of the first test evaluation board 601.

The transmission characteristics of patterns equal in length to the differential transmission line patterns of the evaluation board can be measured with the first test evaluation board 601.

Figure 18:
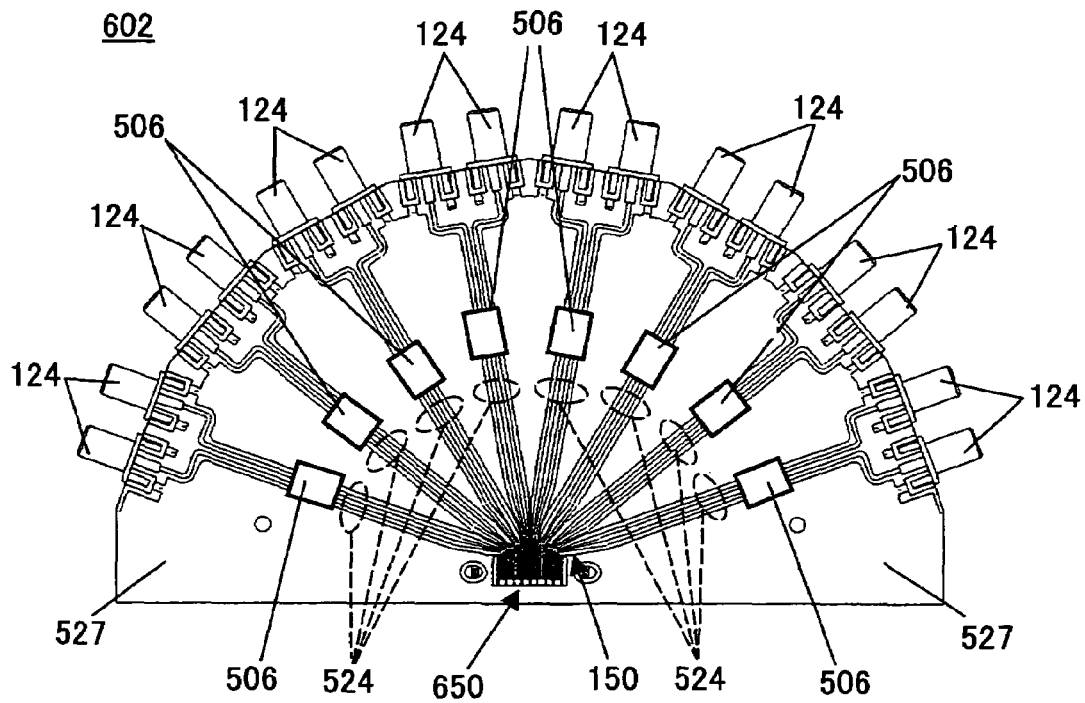
FIG. 18 is a top plan view of a second test evaluation board according to the fourth embodiment of the present invention.
Figure 19:
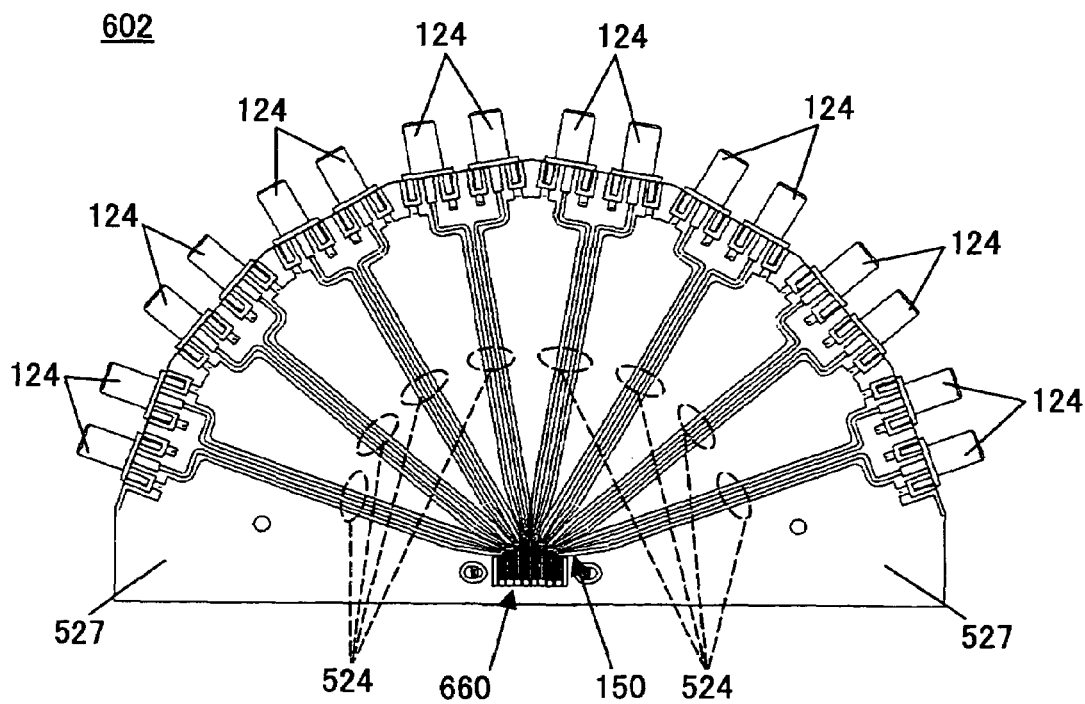
FIG. 19 is a bottom plan view of the second test evaluation board according to the fourth embodiment of the present invention.
Figure 20A:
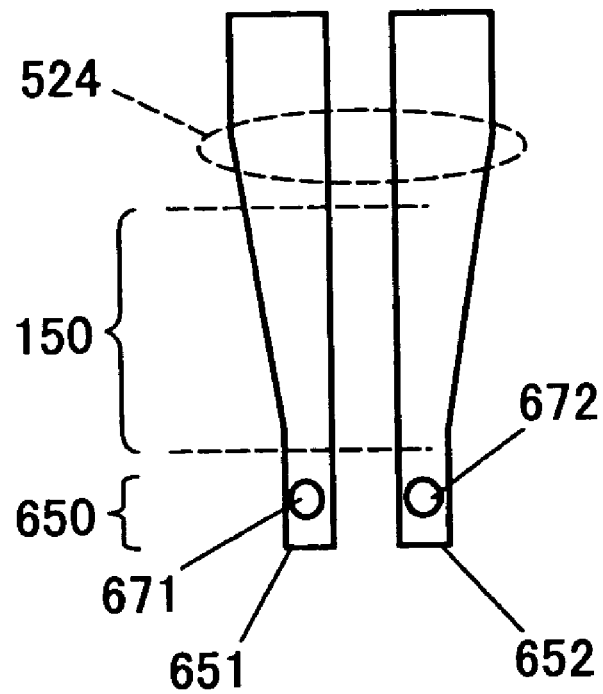
FIG. 20A is a top plan view of part of the second test evaluation board according to the fourth embodiment of the present invention.
Figure 20B:
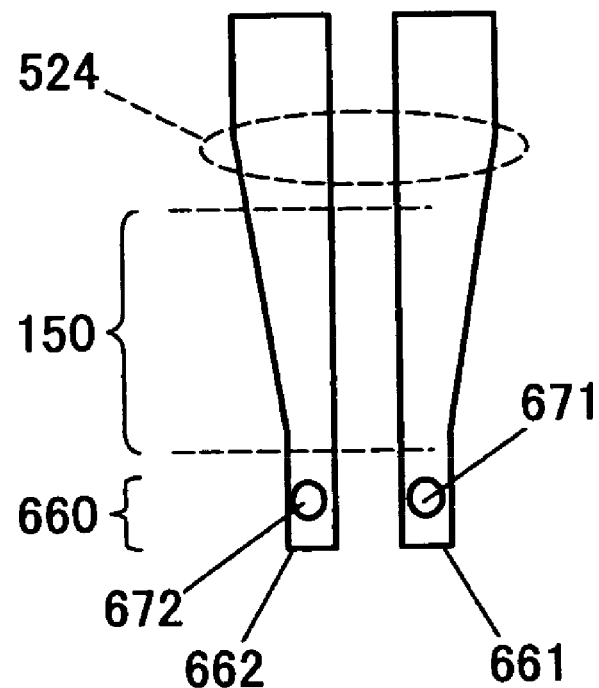
FIG. 20B is a bottom plan view of part of the second test evaluation board according to the fourth embodiment of the present invention.

FIG. 18 is a top plan view of the second test evaluation board 602. FIG. 19 is a bottom plan view of the second test evaluation board 602. FIG. 20A is a top plan view of part of the second test evaluation board 602. FIG. 20B is a bottom plan view of part of the second test evaluation board 602.

Substantially the same patterns as the differential transmission line patterns 524 formed on the bottom surface of the evaluation board 501 are formed on the top surface of the second test evaluation board 602. The turnback pattern part 540 of each differential transmission line pattern 524 is replaced by a connection pattern part 650. The connection pattern part 650 includes a connection pattern 651 and a connection pattern 652. The connection patterns 651 and 652 are separated from each other.

Substantially the same patterns as the differential transmission line patterns 524 formed on the bottom surface of the evaluation board 501 are formed on the bottom surface of the second test evaluation board 602. The equalizer circuits 506 are removed. The turnback pattern part 540 of each differential transmission line pattern 524 is replaced by a connection pattern part 660. The connection pattern part 660 includes a connection pattern 661 and a connection pattern 662. The connection patterns 661 and 662 are separated from each other.

In the second test evaluation board 602, the connection pattern 651 of each differential transmission line pattern 524 formed on the top surface is connected through a via 671 to the connection pattern 661 of the corresponding differential transmission line pattern 524 formed on the bottom surface. Further, the connection pattern 652 of each differential transmission line pattern 524 formed on the top surface is connected through a via 672 to the connection pattern 662 of the corresponding differential transmission line pattern 524 formed on the bottom surface.

The transmission characteristics of patterns twice the differential transmission line patterns of the evaluation board in length can be measured with the second test evaluation board 602.

(Evaluation Method)

Next, a description is given of an evaluation operation according to the fourth embodiment.

Figure 21:
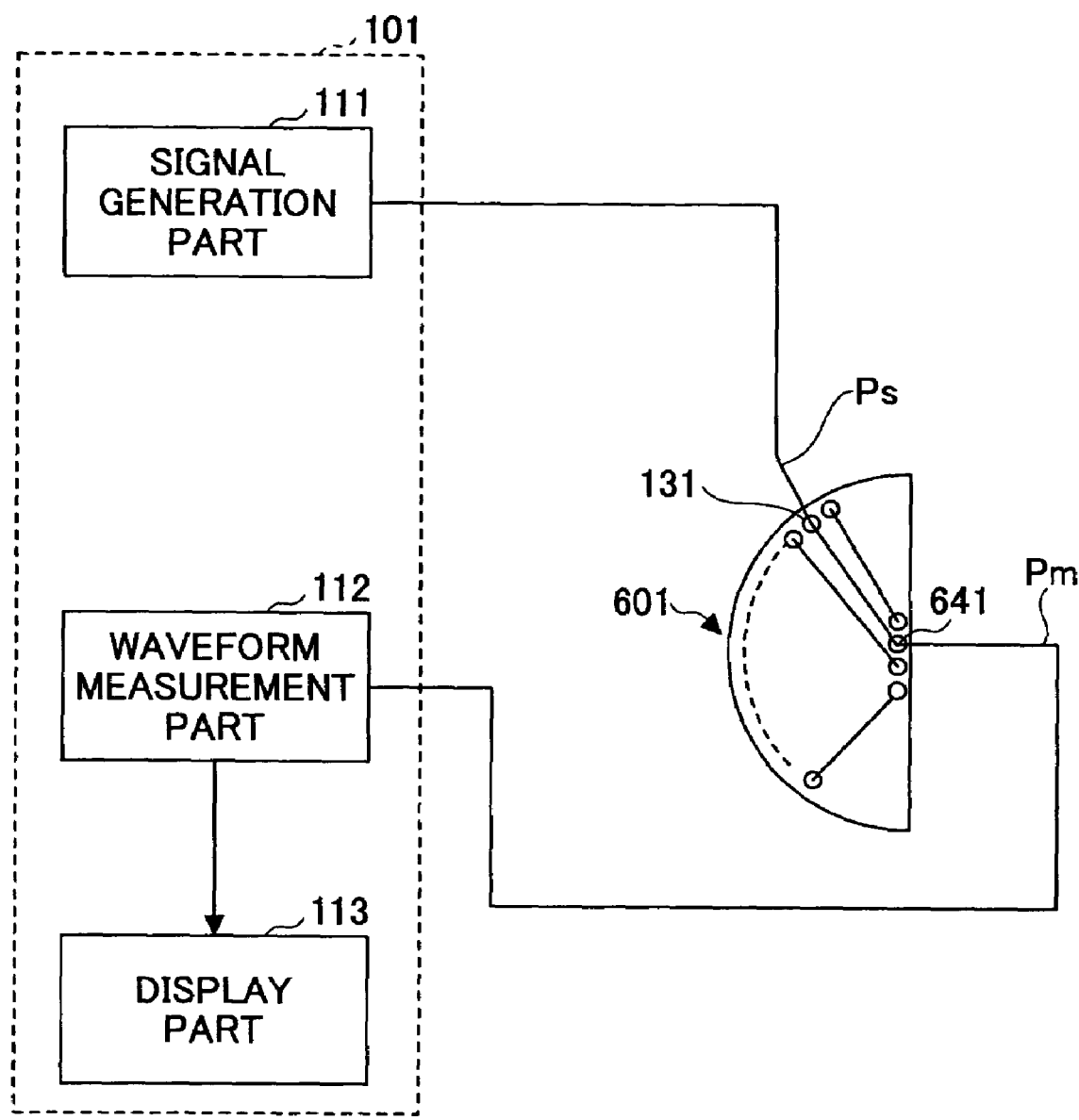
FIG. 21 is a diagram for illustrating an evaluation board evaluation operation according to the fourth embodiment of the present invention.
Figure 22:
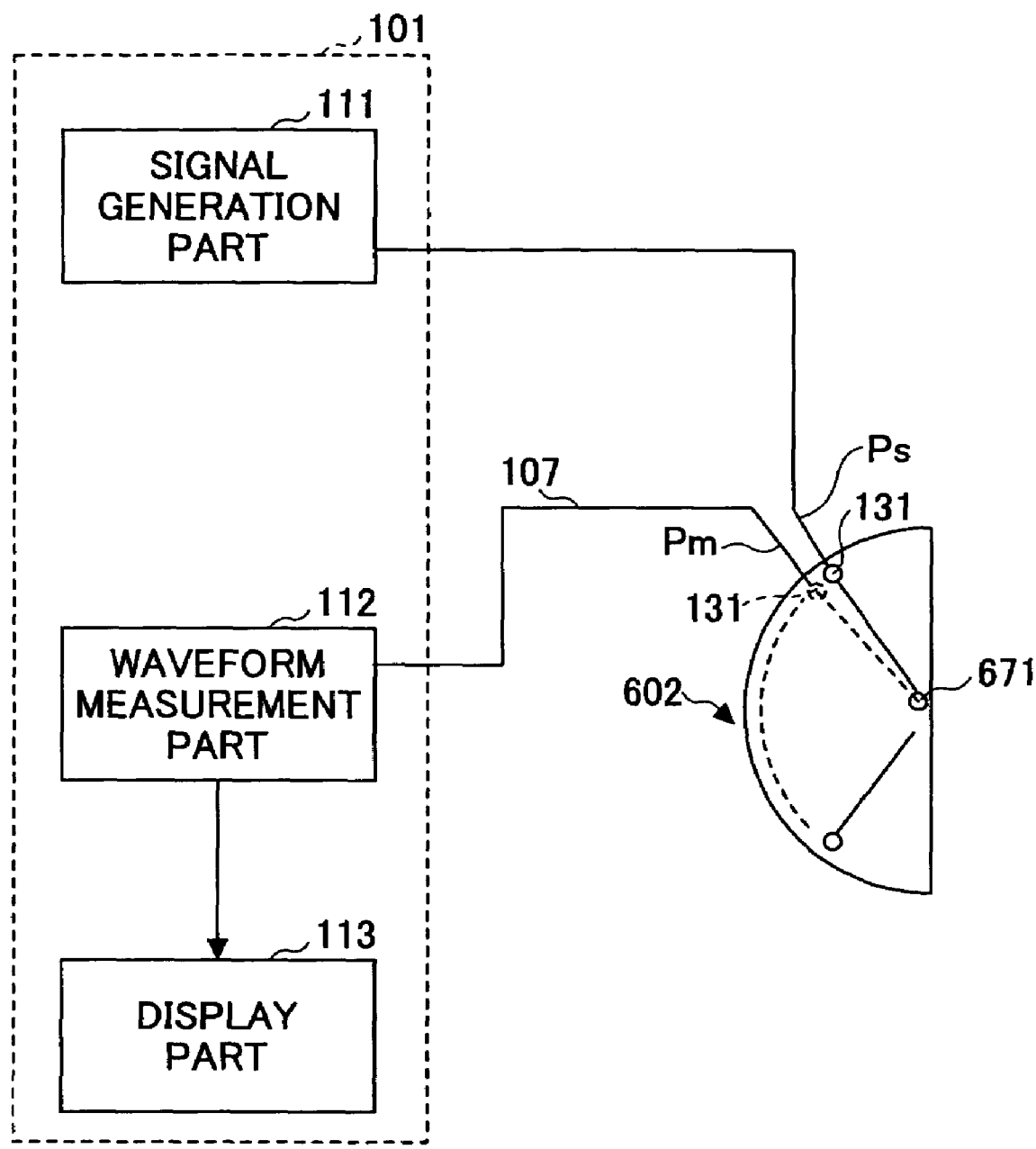
FIG. 22 is another diagram for illustrating the evaluation board evaluation operation according to the fourth embodiment of the present invention.

FIGS. 21 and 22 are diagrams for illustrating an evaluation operation according to the fourth embodiment.

According to this embodiment, before evaluating the equalizer circuits 106, the probe Ps of the signal generation part 111 and the probe Pm of the waveform measurement part 112 are brought into contact with the corresponding connection pads 131 and 641, respectively, of the first test evaluation board 601 as shown in FIG. 21. Thereby, the transmission characteristics of the corresponding differential transmission line pattern 524 are measured. The transmission characteristics include insertion loss, crosstalk, reflection loss, and an eye pattern. As a result, the transmission characteristics of patterns equal in length to the differential transmission line patterns of the evaluation board can be measured.

Next, as shown in FIG. 22, the probe Ps of the signal generation part 111 is brought into contact with the corresponding connection pad 131 on the top surface of the second test evaluation board 602, and the probe Pm of the waveform measurement part 112 is brought into contact with the corresponding connection pad 131 on the bottom surface of the second test evaluation board 602. Thereby, the transmission characteristics of the "double-length" differential transmission line pattern are measured. The transmission characteristics include insertion loss, crosstalk, reflection loss, and an eye pattern. As a result, the transmission characteristics of patterns twice the differential transmission line patterns of the evaluation board in length can be measured.

In the case of simply measuring the transmission characteristics of the cable assembly 103, each short-circuit pattern part 506 corresponding to a part on which to mount the equalizer circuit 106 may be omitted and replaced by a pattern connecting the differential transmission lines before and after the short-circuit pattern part 506.

(Variation of Second Test Evaluation Board 602)

Figure 23:
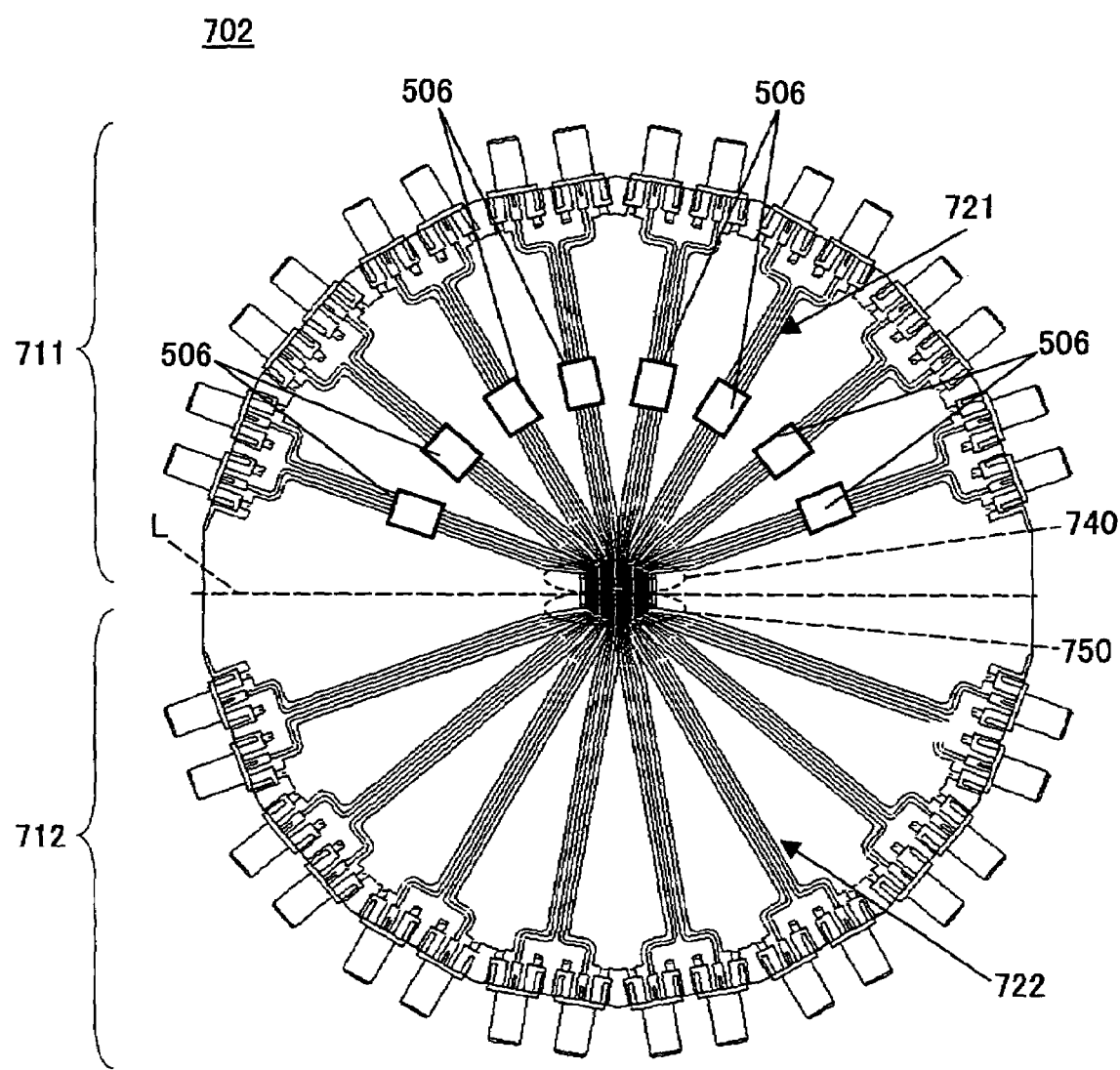
FIG. 23 is a plan view of a variation of the second test evaluation board according to the fourth embodiment of the present invention.
Figure 24:
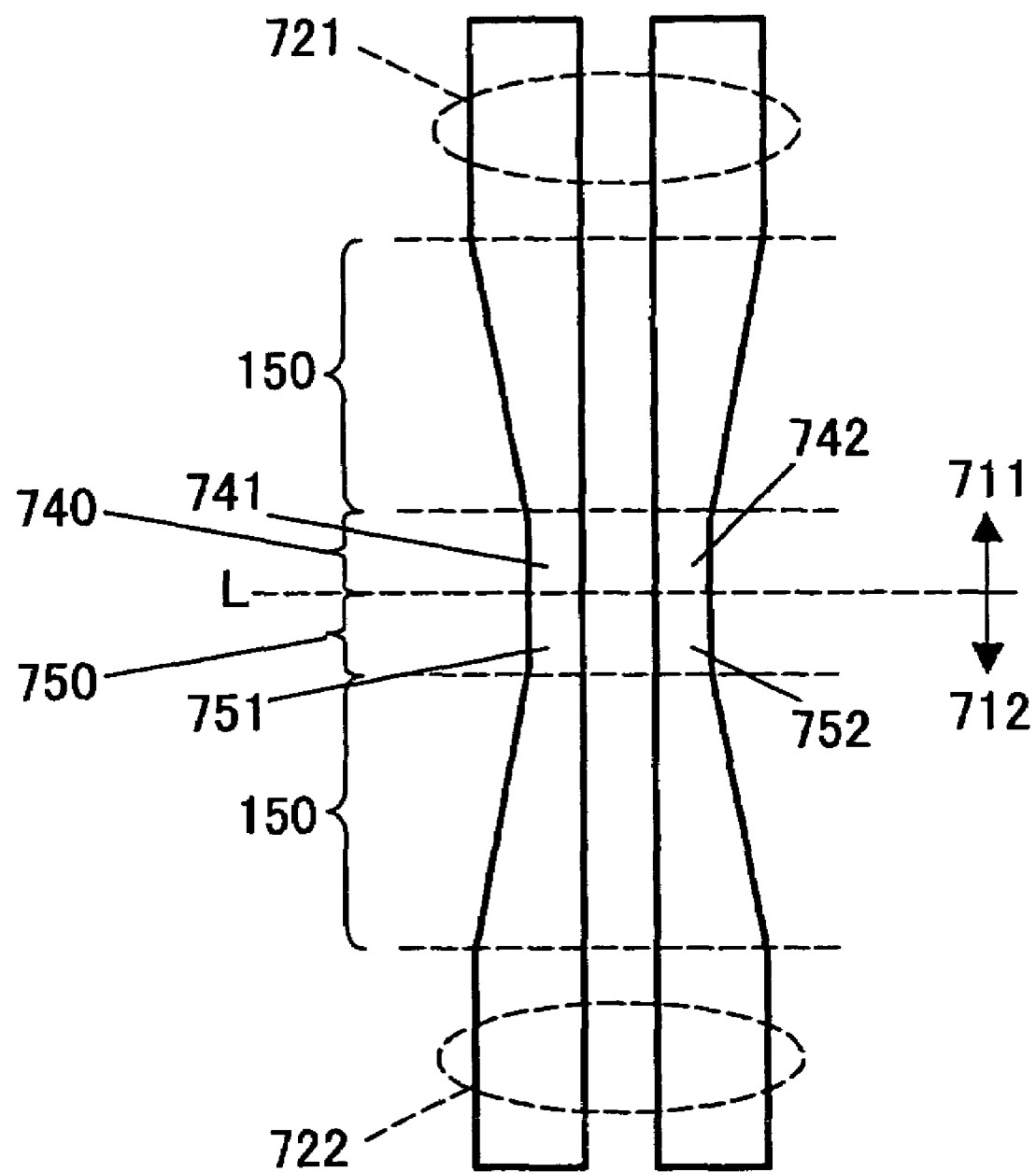
FIG. 24 is a plan view of part of the variation of the second test evaluation board according to the fourth embodiment of the present invention.

FIG. 23 is a plan view of a variation of the second test evaluation board 602. FIG. 24 is a plan view of part of the variation of the second test evaluation board 602. In FIGS. 23 and 24, the same elements as those of FIGS. 18 through 20B are referred to by the same numerals, and a description thereof is omitted.

Referring to FIG. 23, a second test evaluation board 702, which is a variation of the second test evaluation board 602 according to this embodiment, includes a first differential transmission line pattern formation part 711 and a second differential transmission line pattern formation part 712.

First differential transmission line patterns 721, which are substantially equal to the differential transmission line patterns 524, are formed in the first differential transmission line pattern formation part 711. Each first differential transmission line pattern 721 has a connection pattern part 740 in place of the turnback pattern part 540. The connection pattern part 740 is separated into a connection pattern 741 and a connection pattern 742. Like each differential transmission line pattern 524, each first differential transmission line pattern 721 includes the short-circuit pattern part 506.

Second differential transmission line patterns 722, which are substantially equal to the differential transmission line patterns 524, are formed in the second differential transmission line pattern formation part 712. Each second differential transmission line pattern 722 has a connection pattern part 750 in place of the turnback pattern part 540. The connection pattern part 750 includes a connection pattern 751 and a connection pattern 752. The connection patterns 751 and 752 are separated from each other. In the case of evaluating the equalizer circuits 106, the equalizer circuits 106 are mounted on only one of the evaluation boards connected to both ends of the cable assembly 103. Accordingly, the short-circuit pattern parts 506 are removed from the second differential transmission line patterns 722. The first differential transmission line patterns 721 and the second differential transmission line patterns 722 are formed symmetrically with respect to a line segment L (FIG. 23).

The connection pattern 741 of each first differential transmission line pattern 721 is connected to the connection pattern 751 of the corresponding second differential transmission line pattern 722. The connection pattern 742 of each first differential transmission line pattern 721 is connected to the connection pattern 752 of the corresponding second differential transmission line pattern 722.

Figure 25:
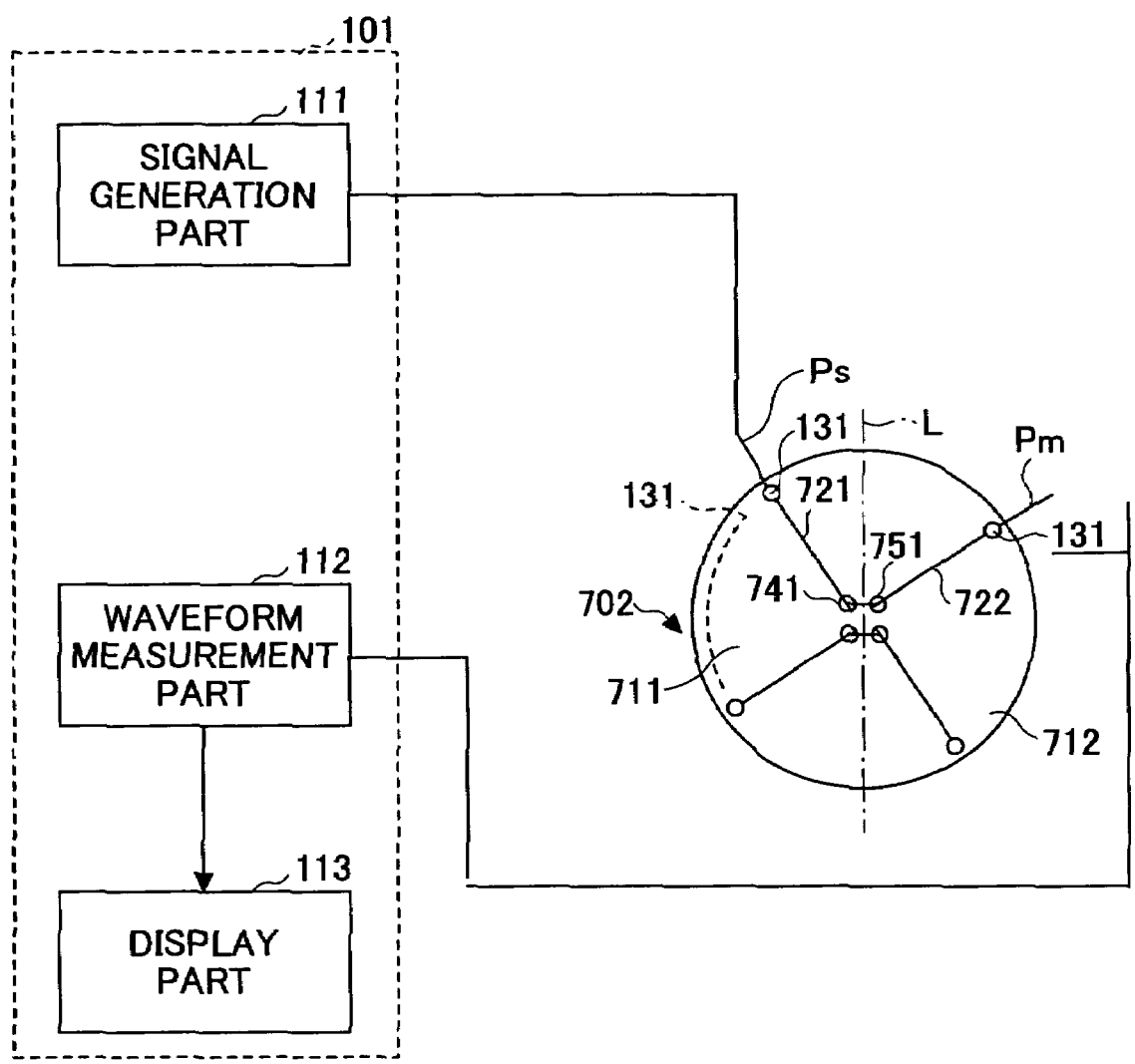
FIG. 25 is a diagram for illustrating an evaluation operation using the variation of the second test evaluation board according to the fourth embodiment of the present invention.

FIG. 25 is a diagram for illustrating an evaluation operation using the second test evaluation board 702.

As shown in FIG. 25, the probe Ps of the signal generation part 111 is brought into contact with the connection pad 131 of the corresponding differential transmission line pattern 721 formed in the first differential transmission line pattern formation part 711, and the probe Pm of the waveform measurement part 112 is brought into contact with the connection pad 131 of the corresponding differential transmission line pattern 722 formed in the second differential transmission line pattern formation part 712, thereby measuring the transmission characteristics of the differential transmission line patterns 721 and 722. The transmission characteristics include insertion loss, crosstalk, reflection loss, and an eye pattern. As a result, the transmission characteristics of patterns twice the differential transmission line patterns of the evaluation board in length can be measured.

The differential transmission patterns in this embodiment are not folded back. Accordingly, it is possible to measure the transmission characteristics of only the evaluation board in a state close to an actual state.

In the case of simply measuring the transmission characteristics of the cable assembly 103, each short-circuit pattern part 506 corresponding to a part on which to mount the equalizer circuit 106 may be omitted and replaced by a pattern connecting the differential transmission lines before and after the short-circuit pattern part 506.

Fifth Embodiment

Figure 26:
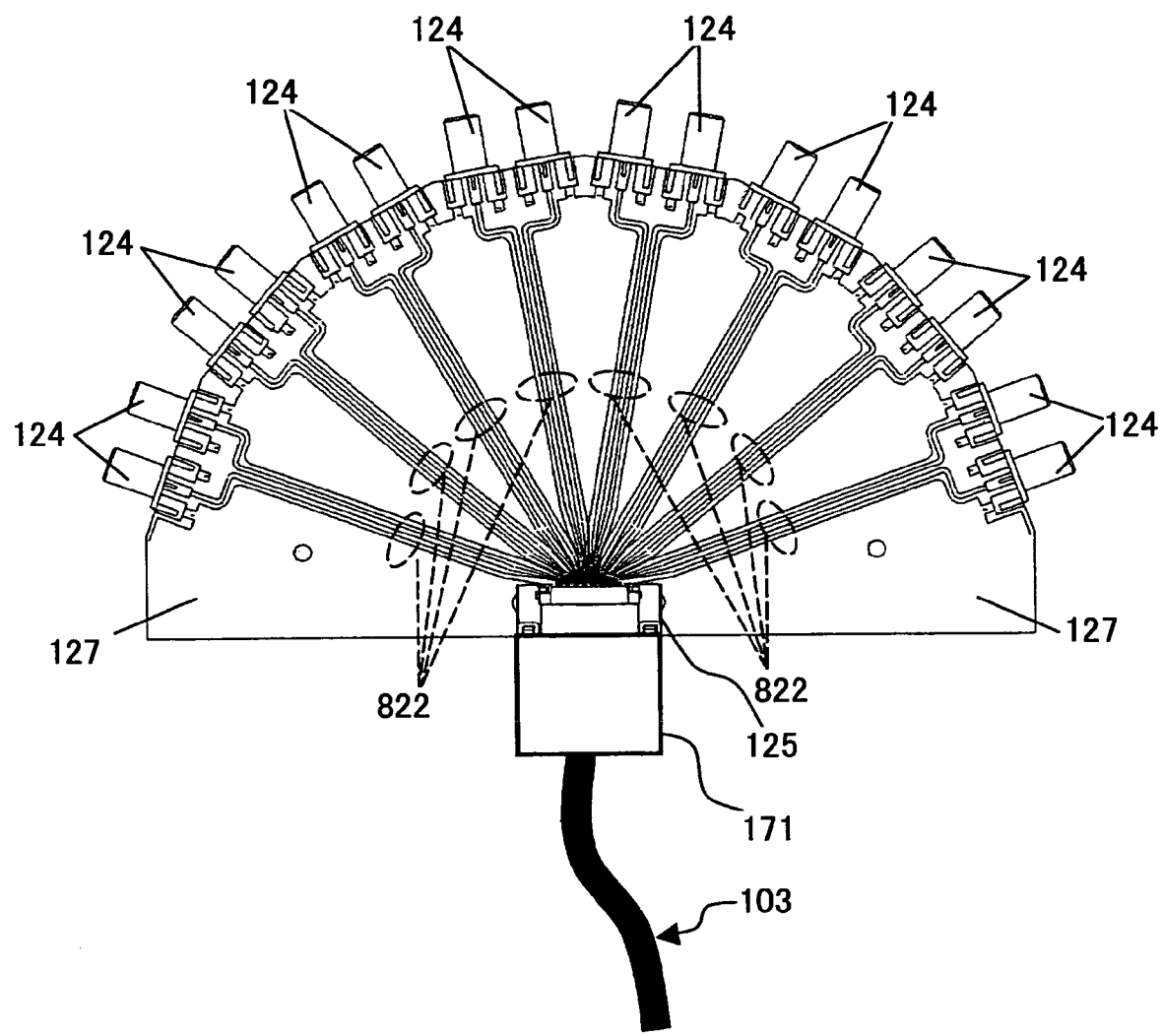
FIG. 26 is a top plan view of an evaluation board according to a fifth embodiment of the present invention.
Figure 27:
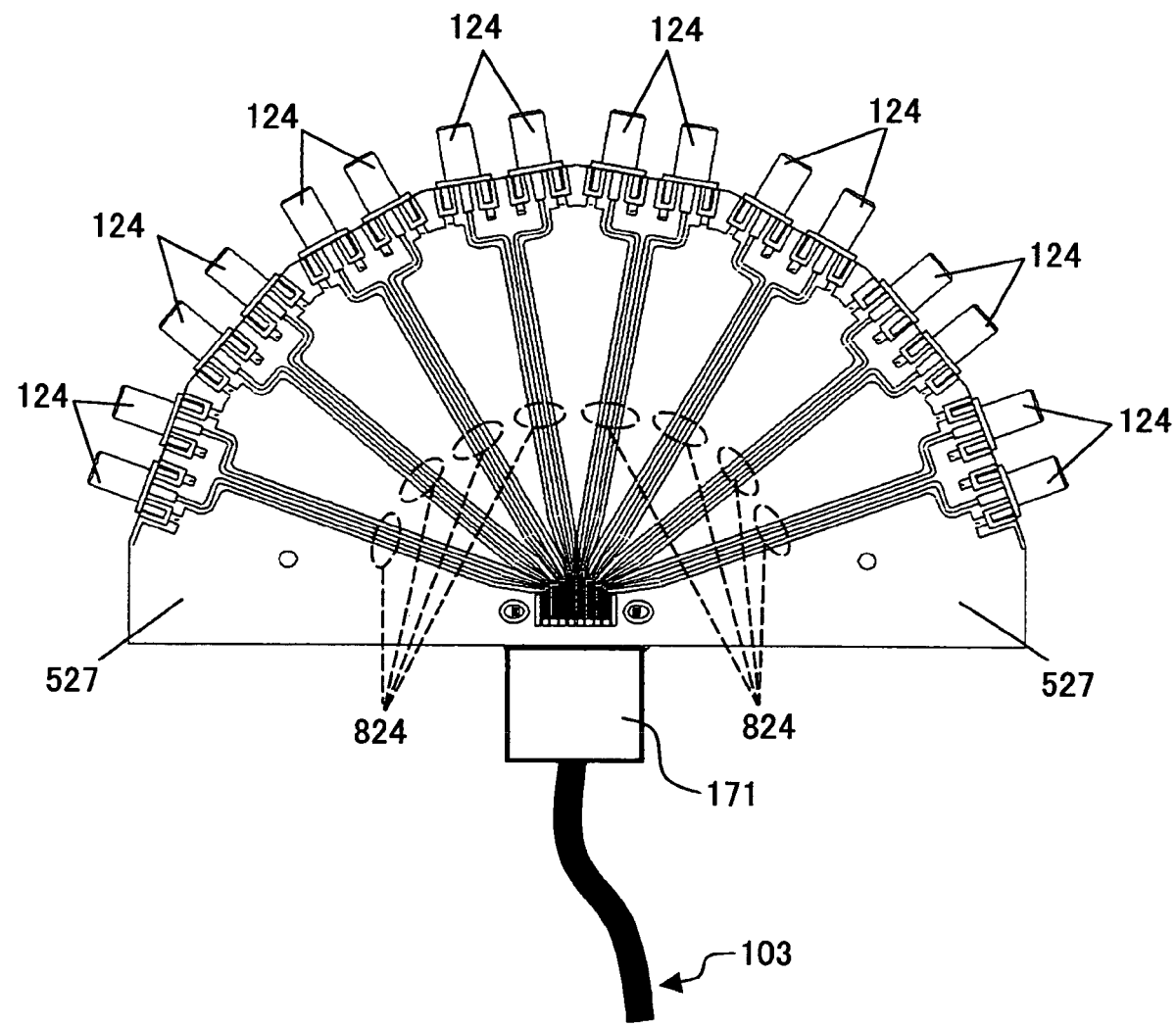
FIG. 27 is a bottom plan view of the evaluation board according to the fifth embodiment of the present invention.

FIG. 26 is a top plan view of an evaluation board 801 according to a fifth embodiment of the present invention. FIG. 27 is a bottom plan view of the evaluation board 801. In FIGS. 26 and 27, the same elements as those of FIGS. 11 and 12 are referred to by the same numerals, and a description thereof is omitted.

In the evaluation board 801, differential transmission line patterns 822 formed on the top surface and differential transmission line patterns 824 formed on the bottom surface are different in configuration from the differential transmission line patterns 122 of FIG. 11 and the differential transmission line patterns 524 of FIG. 12, respectively.

No connection pattern for mounting the equalizer circuit 106 is formed in any differential transmission line pattern 822. Differential transmission lines are formed in each differential transmission line pattern 822. Thus, the evaluation board 801 is used for measuring the cable assembly 103 with no equalizer circuits 106. The short-circuit pattern part 506 is removed from each differential transmission line pattern 824, and is replaced by a pattern connecting the differential transmission lines before and after the short-circuit pattern part 506.

Sixth Embodiment

Figure 28:
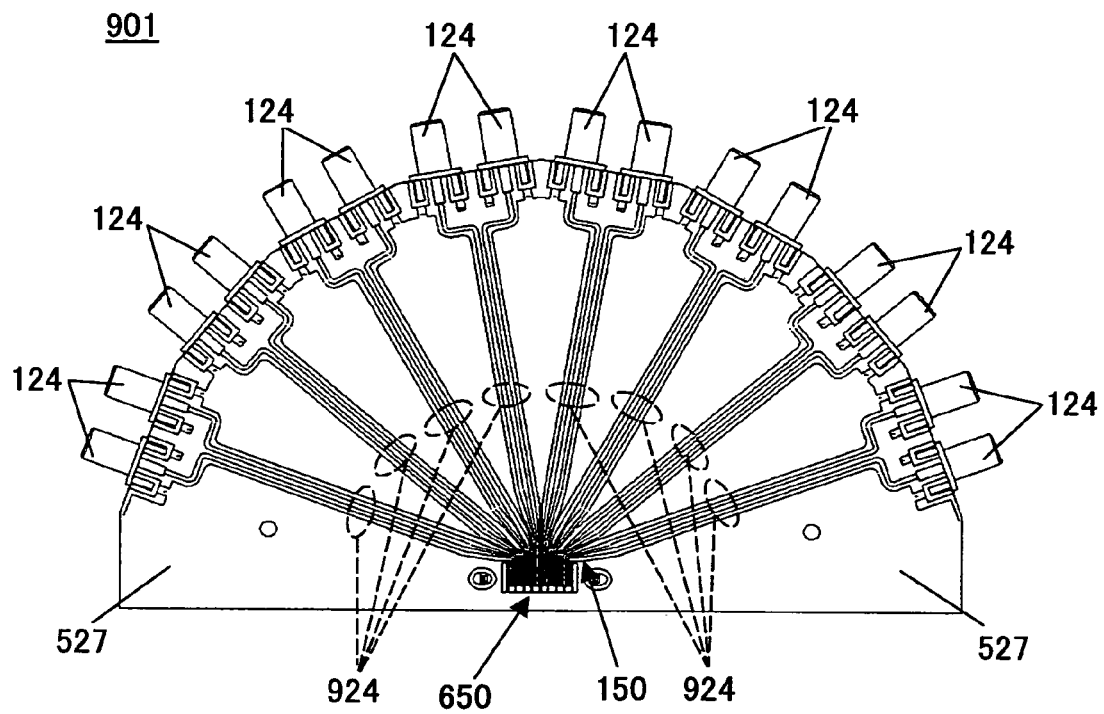
FIG. 28 is a top plan view of an evaluation board according to a sixth embodiment of the present invention.
Figure 29:
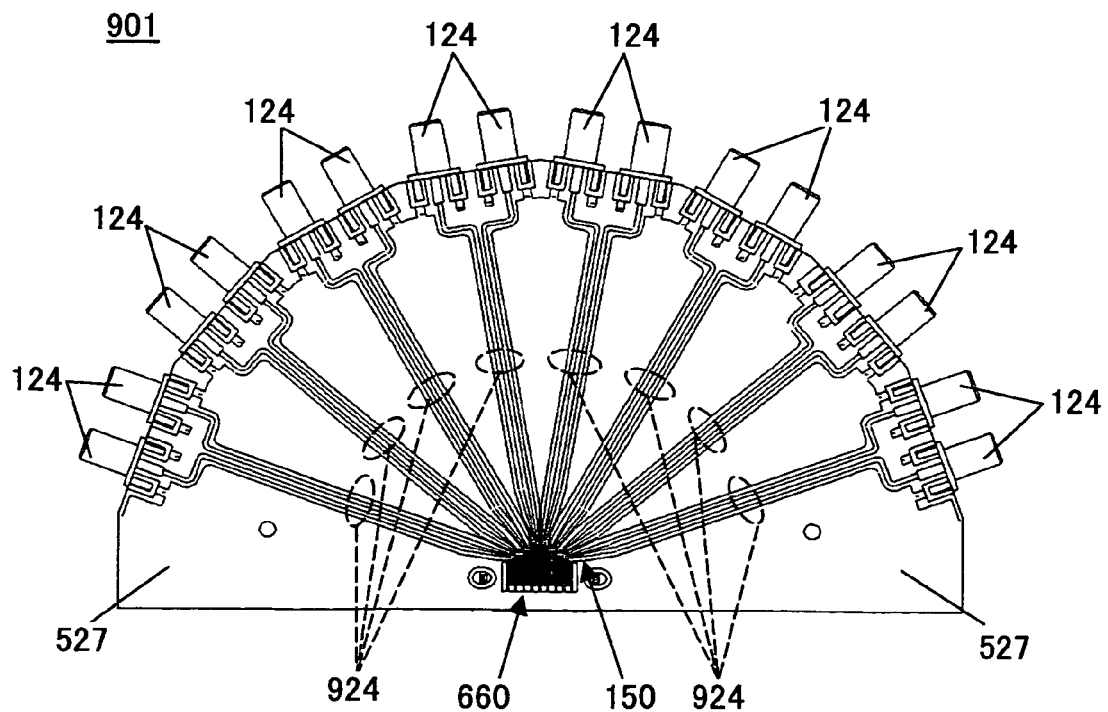
FIG. 29 is a bottom plan view of the evaluation board according to the sixth embodiment of the present invention.

FIG. 28 is a top plan view of an evaluation board 901 according to a sixth embodiment of the present invention. FIG. 29 is a bottom plan view of the evaluation board 901. In FIGS. 28 and 29, the same elements as those of FIGS. 18 through 20B are referred to by the same numerals, and a description thereof is omitted.

In the evaluation board 901 according to this embodiment, on both top and bottom surfaces, the short-circuit pattern part 506 is removed from each of differential transmission line patterns 924, and is replaced by a pattern connecting the differential transmission lines before and after the short-circuit pattern part 506.

Seventh Embodiment

Figure 30:
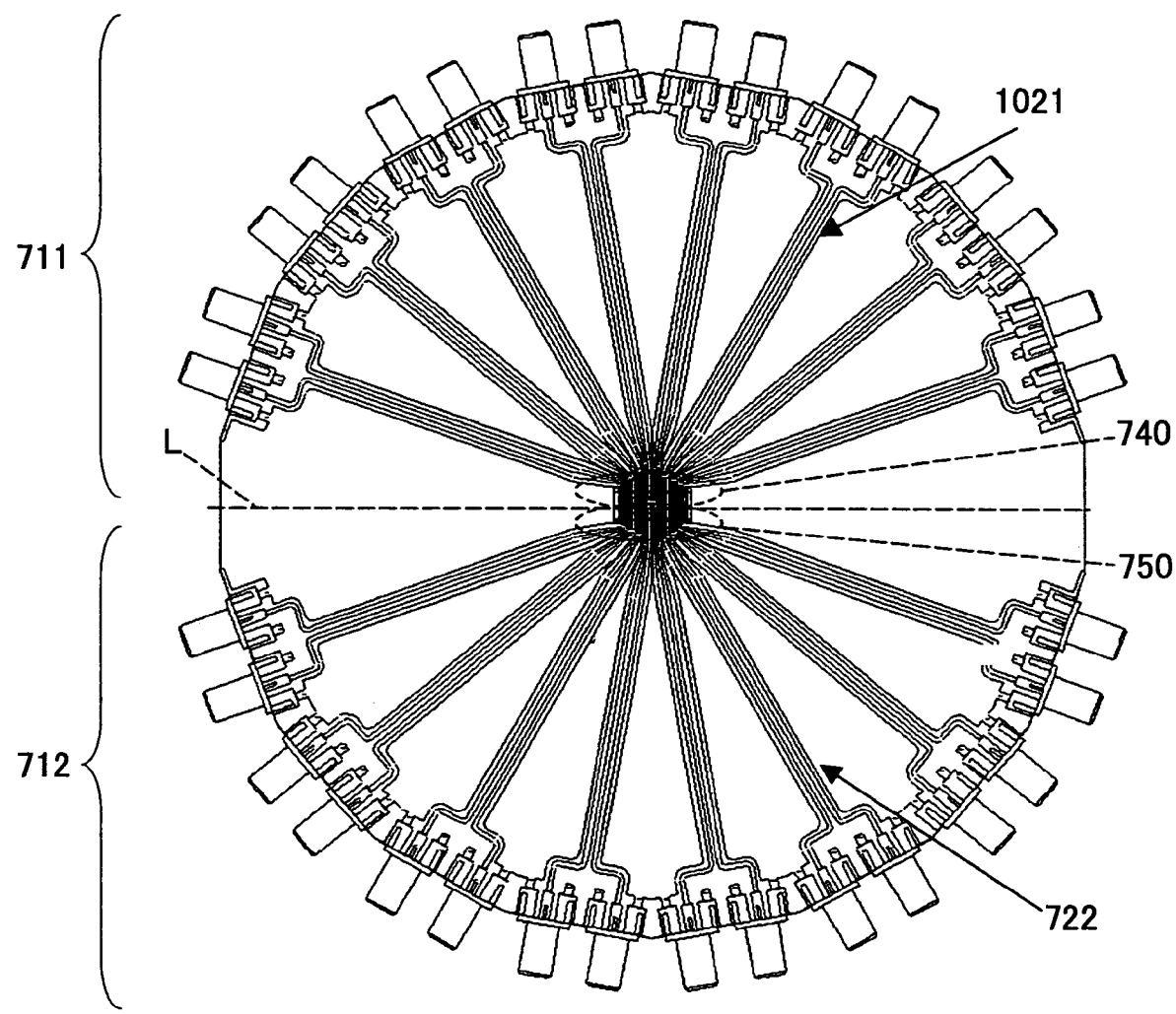
FIG. 30 is a plan view of an evaluation board according to a seventh embodiment of the present invention.

FIG. 30 is a plan view of an evaluation board 1001 according to a seventh embodiment of the present invention. In FIG. 30, the same elements as those of FIG. 23 are referred to by the same numerals, and a description thereof is omitted.

In the evaluation board 1001, the short-circuit pattern part 506 is removed from each of first differential transmission line patterns 1021, and is replaced by a pattern connecting the differential transmission lines before and after the short-circuit pattern part 506. As a result, the first differential transmission line patterns 1021 are mirror images of the second differential transmission line patterns 722 with respect to the line segment L.

The present invention is not limited to the specifically disclosed embodiments, and variations and modifications may be made without departing from the scope of the present invention.

The present application is based on Japanese Priority Patent Applications No. 2005-017212, filed on Jan. 25, 2005, and No. 2005-099879, filed on Mar. 30, 2005, the entire contents of which are hereby incorporated by reference.

What is claimed is:

1. An evaluation board for evaluating an equalizer circuit to be mounted in a cable assembly external to the evaluation board, the evaluation board comprising:
a plurality of differential interconnection line patterns, each having a first end and a second end, each interconnection line pattern further comprising a circuit configured to equalize a transmission characteristic of the external cable assembly;
a first connector, mating to a connector of the external cable assembly, the first connector being provided at and electrically connected to the first ends of the plurality of differential interconnection line patterns;
a plurality of coaxial second connectors, plug-compatible with a measurement device for measuring a transmission characteristic of the cable assembly, the plurality of second coaxial connectors being provided at and electrically connected to each of the second ends of the plurality of differential interconnection patterns.

2. The evaluation board as claimed in claim 1, wherein the circuit configured to equalize a transmission component of the external cable assembly comprises an electronic component to be mounted in the cable assembly.

3. The evaluation board as claimed in claim 1, further comprising:
a socket provided in the interconnection line pattern, wherein the circuit includes a circuit module detachably attached to the socket, comprising a plurality of circuits configured to equalize a transmission characteristic of the external cable assembly.

4. The evaluation board as claimed in claim 1, wherein:
the circuit configured to equalize a transmission characteristic of the external cable assembly is mounted in at least one of the interconnection line patterns on a first surface of the evaluation board;
an additional plurality of differential interconnection line patterns is formed on a second surface of the evaluation board, the second surface facing away from the first surface; and
a part of at least one of the additional interconnection line patterns corresponding to the circuit in the interconnection line pattern is short-circuited.

5. An evaluation board for evaluating an equalizer circuit to be mounted in a cable assembly external to the evaluation board, the evaluation board comprising:
a first plurality of differential interconnection line patterns, each having a first end and a second end, each interconnection line pattern further comprising a circuit configured to equalize a transmission characteristic of the external cable assembly;

a first connector mating to a connector of the external cable assembly, the first connector being provided at and electrically connected to the first ends of the plurality of differential interconnection line patterns;

a plurality of coaxial second connectors, plug-compatible with a measurement device for measuring a transmission characteristic of the cable assembly, the plurality of second coaxial connectors being provided at the second end of the interconnection pattern, and a second plurality of differential interconnection line patterns equal to the first plurality of differential interconnection line patterns, wherein the first and second pluralities of differential interconnection line patterns are formed on first and second opposite surfaces, respectively, of the evaluation board.

6. A board for measuring a transmission characteristic of an evaluation board having an interconnection line pattern formed thereon, the interconnection line pattern having a first end to be externally connected to a cable assembly and a second end to be connected to a measurement device measuring a transmission characteristic of the cable assembly, the board comprising:

first and second interconnection line patterns each substantially equal to the interconnection line pattern of the evaluation board, the first and second interconnection line patterns being formed on first and second opposite surfaces, respectively, of the board, wherein an end of the first interconnection line pattern and an end of the second interconnection line pattern are connected through a via.

7. A board for measuring a transmission characteristic of an evaluation board having an interconnection line pattern formed thereon, the interconnection line pattern having a first end to be externally connected to a cable assembly and a second end to be connected to a measurement device measuring a transmission characteristic of the cable assembly, the board comprising:

a first pattern including a first interconnection line pattern equivalent to the interconnection line pattern of the evaluation board; and a second pattern including a second interconnection line pattern equivalent to the interconnection line pattern of the evaluation board, wherein the first pattern and the second pattern are formed in a same plane so that one end of the first pattern and one end of the second pattern are connected.

8. A method of evaluating an external cable assembly, comprising the steps of:

connecting an evaluation board externally through coaxial connectors to a measurement device, and connecting the cable assembly without an equalizer circuit to the evaluation board, the evaluation board including a plurality of differential interconnection line patterns, each of the plurality of the differential line patterns comprising a circuit configured to equalize a transmission characteristic of the cable assembly;

measuring the transmission characteristic of the cable assembly using the measurement device; and evaluating the equalizer circuit to be mounted in the cable assembly based on a result of the measurement.

9. The method as claimed in claim 8, wherein the equalizer circuit of the evaluation board comprises a component equal to a component employed in the equalizer circuit to be mounted in the cable assembly.

10. The method as claimed in claim 8, further comprising the steps of:

measuring a transmission characteristic of the evaluation board using at least one of a plurality of separate differential interconnection line patterns for measurement substantially equal to a differential interconnection line pattern of the evaluation board; and evaluating the transmission characteristic of the cable assembly by eliminating an effect of the measured transmission characteristic of the evaluation board from the measured transmission characteristic of the cable assembly.

11. A method of evaluating an external cable assembly by externally connecting an evaluation board to the cable assembly, comprising the steps of:

(a) measuring a transmission characteristic of the evaluation board using at least one of a plurality of separate differential interconnection line patterns for measurement substantially equal to a differential interconnection line pattern of the evaluation board;

(b) measuring a transmission characteristic of the cable assembly by connecting the cable assembly to the evaluation board; and (c) evaluating the transmission characteristic of the cable assembly by eliminating an effect of the measured transmission characteristic of the evaluation board from the measured transmission characteristic of the external cable assembly.

* * * * *